United States Patent
Han et al.

(10) Patent No.: US 10,121,808 B1
(45) Date of Patent: Nov. 6, 2018

(54) SEMICONDUCTOR DEVICES AND IMAGE SENSORS

(71) Applicant: Samsung Electronics Co., Ltd., Suwon-si, Gyeonggi-do (KR)

(72) Inventors: Dongmin Han, Daegu (KR); Jung-Saeng Kim, Seoul (KR); Seungjoo Nah, Gwangju (KR); Junetaeg Lee, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/840,635

(22) Filed: Dec. 13, 2017

(30) Foreign Application Priority Data

Jun. 13, 2017 (KR) ........................ 10-2017-0074367

(51) Int. Cl.
| | |
|---|---|
| *H01L 27/14* | (2006.01) |
| *H01L 31/0232* | (2014.01) |
| *H01L 27/146* | (2006.01) |
| *H04N 5/374* | (2011.01) |

(52) U.S. Cl.
CPC .. *H01L 27/14621* (2013.01); *H01L 27/14607* (2013.01); *H01L 27/14623* (2013.01); *H01L 27/14627* (2013.01); *H01L 27/14685* (2013.01); *H01L 27/1464* (2013.01); *H01L 27/14629* (2013.01); *H01L 27/14641* (2013.01); *H04N 5/374* (2013.01)

(58) Field of Classification Search
CPC ......... H01L 27/14627; H01L 27/14685; H01L 27/14607; H01L 27/14621; H01L 27/14623; H01L 27/14629; H01L 27/1464; H01L 27/14641; H01L 27/14687; H01L 27/14636; H01L 27/14645; H04N 5/374
USPC .... 257/432, 431, 435, 440, 446; 438/48, 54, 438/65, 69
See application file for complete search history.

(56) References Cited

U.S. PATENT DOCUMENTS

| | | | |
|---|---|---|---|
| 8,334,083 | B2 | 12/2012 | Luong et al. |
| 2003/0210408 | A1 | 11/2003 | Jun et al. |
| 2004/0009412 | A1* | 1/2004 | Kang ........................ G03F 1/34 430/5 |
| 2005/0123845 | A1 | 6/2005 | Huh et al. |

(Continued)

FOREIGN PATENT DOCUMENTS

| | | |
|---|---|---|
| KR | 10-0668742 B1 | 1/2007 |
| KR | 2008-0051554 A | 6/2008 |

*Primary Examiner* — Thinh T Nguyen
(74) *Attorney, Agent, or Firm* — Harness, Dickey & Pierce, P.L.C.

(57) ABSTRACT

A device includes first patterns, second patterns, and a second sample pattern on a semiconductor substrate. The second patterns are horizontally spaced apart at an equal interval from the second sample pattern. The second sample pattern includes first and second sidewall facing each other, a first point on the first sidewall, and a second point on the second sidewall. The second sample pattern and the most adjacent first pattern in relation to the second sample pattern are spaced apart from each other at a first horizontal distance in a direction parallel to a line connecting the first point and the second point. The first horizontal distance is greater than a second horizontal distance in the direction between one second pattern of the second patterns and a most adjacent first pattern in relation to the one second pattern.

20 Claims, 22 Drawing Sheets

(56) References Cited

U.S. PATENT DOCUMENTS

| | | |
|---|---|---|
| 2008/0121880 A1 | 5/2008 | Park |
| 2015/0206806 A1 | 7/2015 | Leem et al. |
| 2016/0125121 A1 | 5/2016 | Ning et al. |
| 2016/0133467 A1 | 5/2016 | Sherman et al. |

* cited by examiner

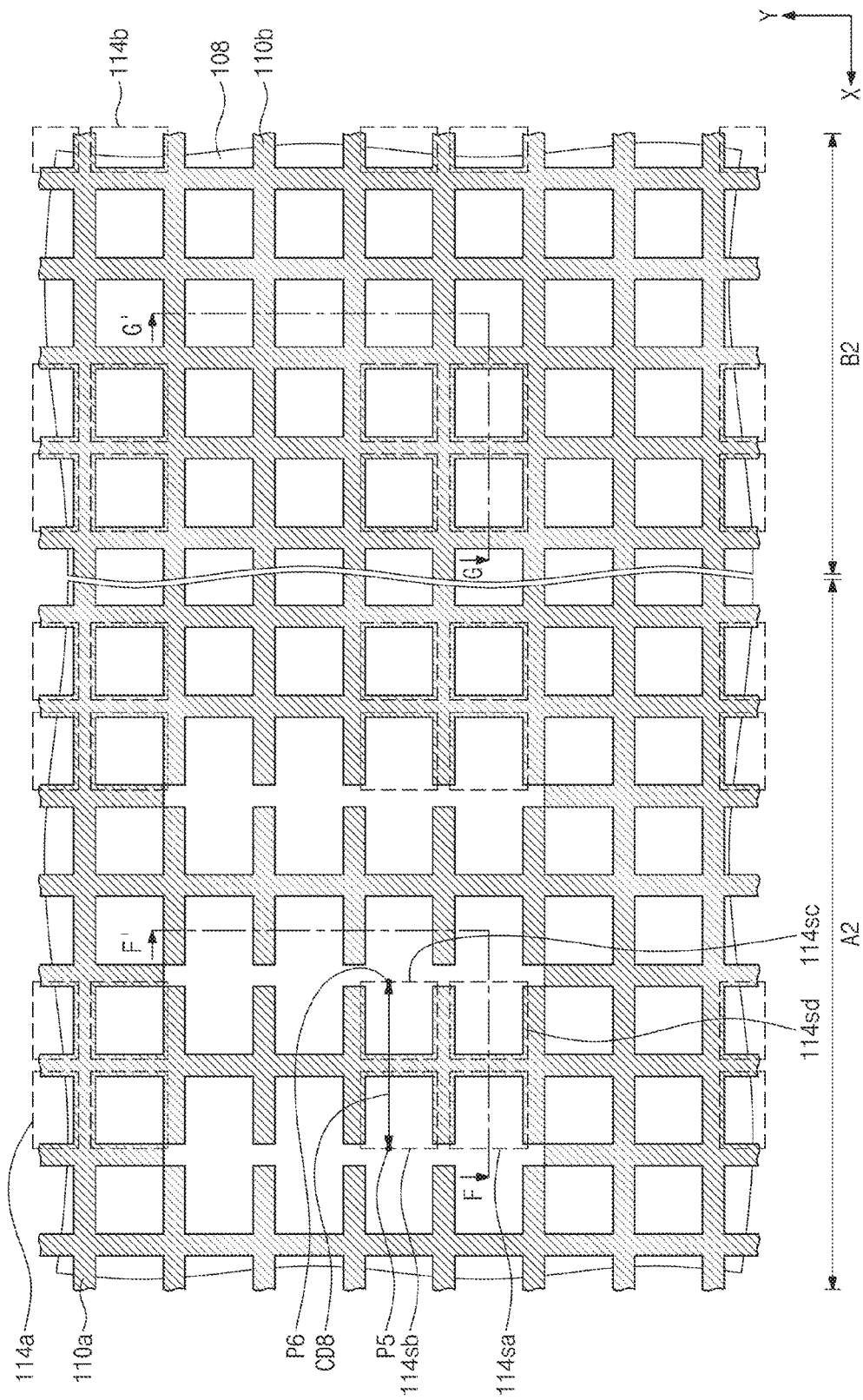

SEMICONDUCTOR DEVICES AND IMAGE SENSORS

CROSS-REFERENCE TO RELATED APPLICATIONS

This U.S. nonprovisional patent application claims priority under 35 U.S.C. § 119 of Korean Patent Application No. 10-2017-0074367 filed on Jun. 13, 2017 entire contents of which are hereby incorporated by reference.

BACKGROUND

The present inventive concepts relate to semiconductor devices and image sensor. Semiconductor devices are considered to be an important factor in the electronics industry because of their small size, multi-function capability, and/or low fabrication cost. Semiconductor devices are highly integrated with the remarkable development of the electronic industry. Semiconductor devices may include patterns, and line widths of patterns of the semiconductor device are being reduced to enable high integration of semiconductor devices. In some cases, new exposure techniques and/or expensive exposure techniques are utilized to enable the formation of semiconductor device patterns having a relatively high degree of fineness of the patterns. The utilization of such techniques may render it difficult to highly integrate a semiconductor device. Thus, various avenues of research have recently been conducted to develop new integration techniques that enable high integration of semiconductor devices that include patterns having a relatively high degree of fineness.

SUMMARY

Some example embodiments of the present inventive concepts provide a highly reliable semiconductor device and/or a method of manufacturing the same.

Some example embodiments of the present inventive concepts provide a highly reliable image sensor and/or a method of manufacturing the same.

According to some example embodiments of the present inventive concepts, a semiconductor device may include a plurality of first patterns on a semiconductor substrate; and a plurality of second patterns and at least one second sample pattern on the semiconductor substrate. The second patterns and the at least one second sample pattern may have a common shape and width, the second patterns being horizontally spaced apart at an equal interval from the at least one second sample pattern. The second sample pattern may include a first sidewall, a second sidewall facing the first sidewall, a first point on the first sidewall, and a second point on the second sidewall. The second sample pattern and an adjacent first pattern of the plurality of first patterns in relation to the second sample pattern may be spaced apart from each other at a first horizontal distance in a direction parallel to a line connecting the first point and the second point, the first horizontal distance greater than a second horizontal distance in the direction between one second pattern of the plurality of second patterns and an adjacent first pattern of the plurality of first patterns in relation to the one second pattern.

According to some example embodiments of the present inventive concepts, a semiconductor device may include a plurality of first device patterns on a device region of a semiconductor substrate and a plurality of first dummy patterns on a dummy region of the semiconductor substrate, a plurality of second device patterns on the device region of the semiconductor substrate, and a plurality of second dummy patterns and at least one second sample dummy pattern on the dummy region of the semiconductor substrate. The second sample dummy pattern may include a first sidewall, a second sidewall facing the first sidewall, a first point on the first sidewall, and a second point on the second sidewall. The at least one second sample dummy pattern and an adjacent first dummy pattern of the plurality of first dummy patterns in relation to the second sample dummy pattern may be spaced apart from each other at a first horizontal distance in a direction parallel to a line connecting the first point and the second point, the first horizontal distance greater than a second horizontal distance in the direction between one second device pattern of the plurality of second device patterns and an adjacent first device pattern of the plurality of first device patterns in relation to the one second device pattern.

According to some example embodiments of the present inventive concepts, an image sensor may include a plurality of actual light-shield patterns on an actual pixel region of a semiconductor substrate and a plurality of dummy light-shield patterns on a dummy pixel region of the semiconductor substrate, a plurality of first actual color filters on the actual pixel region of the semiconductor substrate, and a plurality of first dummy color filters and at least one first sample dummy color filter on the dummy pixel region of the semiconductor substrate. The at least one first sample dummy color filter may include a first sidewall, a second sidewall facing the first sidewall, a first point on the first sidewall, and a second point on the second sidewall. The at least one first sample dummy color filter and an adjacent dummy light-shield pattern of the plurality of dummy light-shield patterns in relation to the at least one first sample dummy color filter may be spaced apart from each other at a first horizontal distance in a first direction parallel to a line connecting the first point and the second point, the first horizontal distance greater than a second horizontal distance in the first direction between one first actual color filter of the plurality of first actual color filters and an adjacent actual light-shield pattern of the plurality of actual light-shield patterns in relation to the one first actual color filter.

BRIEF DESCRIPTION OF THE DRAWINGS

FIG. 15A, FIG. 16A, FIG. 17A, and FIG. 18A illustrate plan views showing a method of manufacturing an image sensor according to some example embodiments of the present inventive concepts.

DETAILED DESCRIPTION OF EMBODIMENTS

Hereinafter, some example embodiments of the present inventive concepts will be described in detail in conjunction with the accompanying drawings to aid in clearly understanding the present inventive concepts.

Figure 1A:
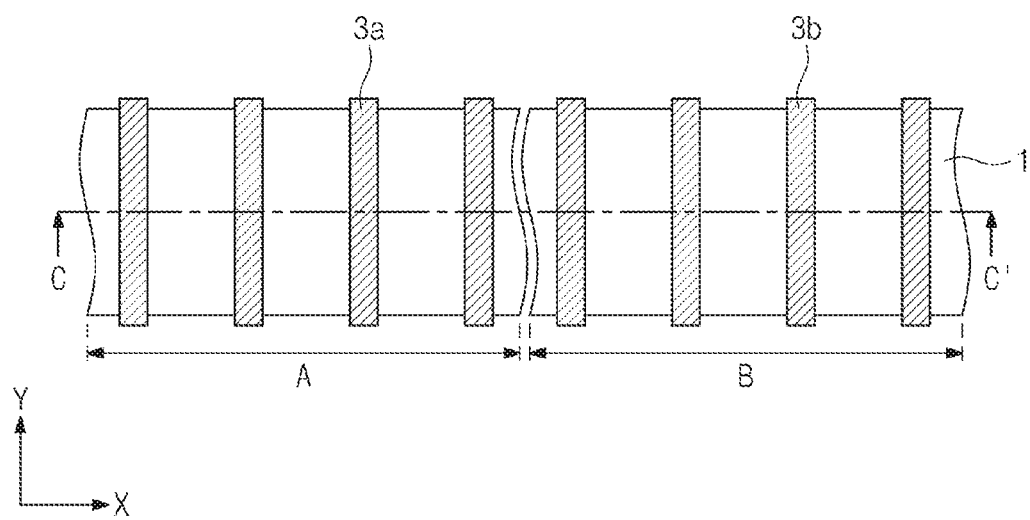
FIG. 1A, FIG. 2A, and FIG. 3A illustrate plan views showing a method of manufacturing a semiconductor device according to some example embodiments of the present inventive concepts.
Figure 1B:
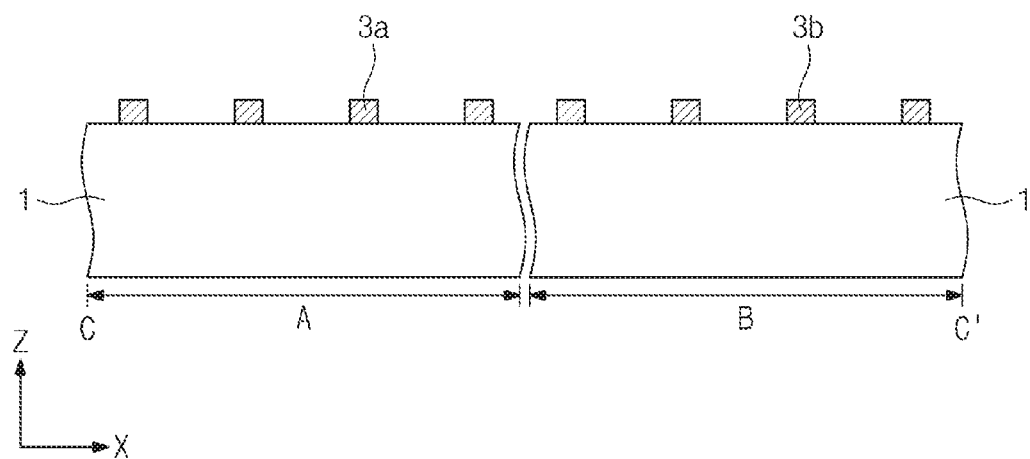
FIG. 1B, FIG. 2B, and FIG. 3B illustrate cross-sectional views taken along line C-C' of FIG. 1A, FIG. 2A, and FIG. 3A, respectively.
Figure 2A:
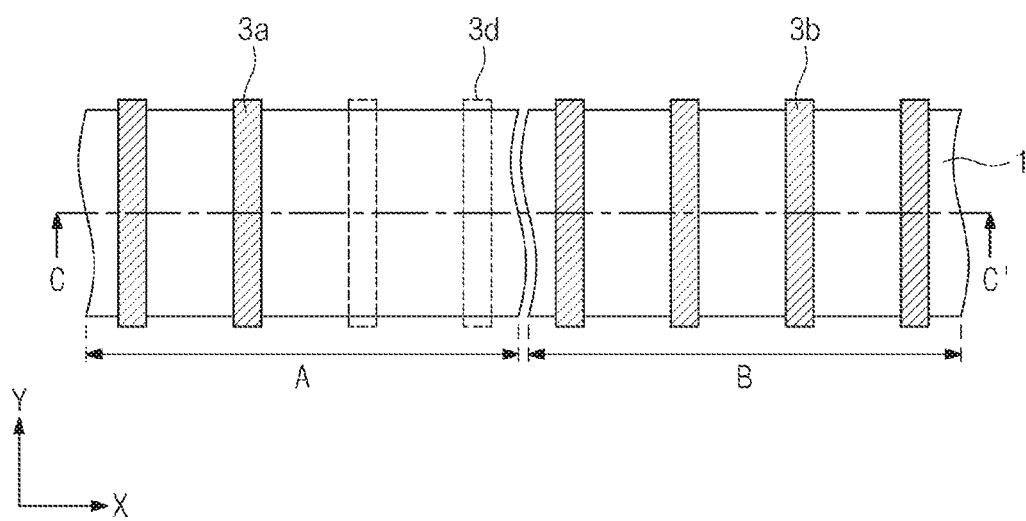
Figure 2B:
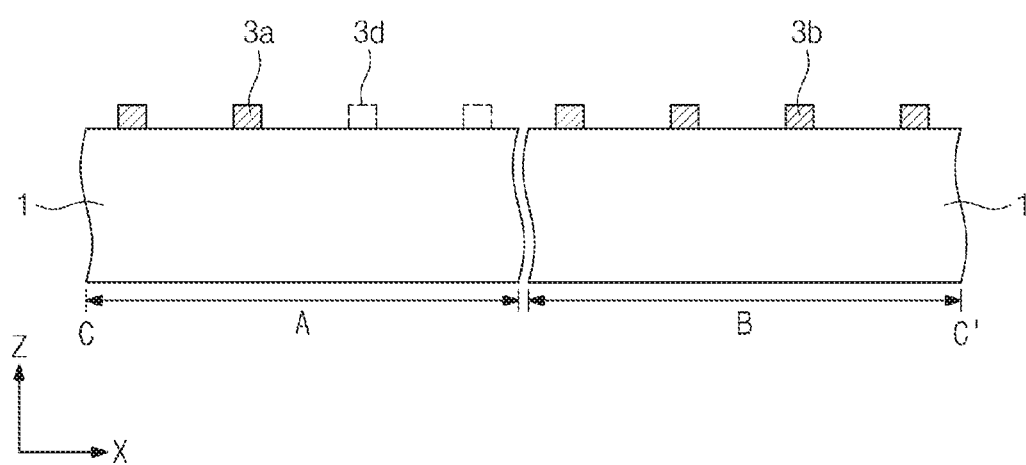
Figure 3A:
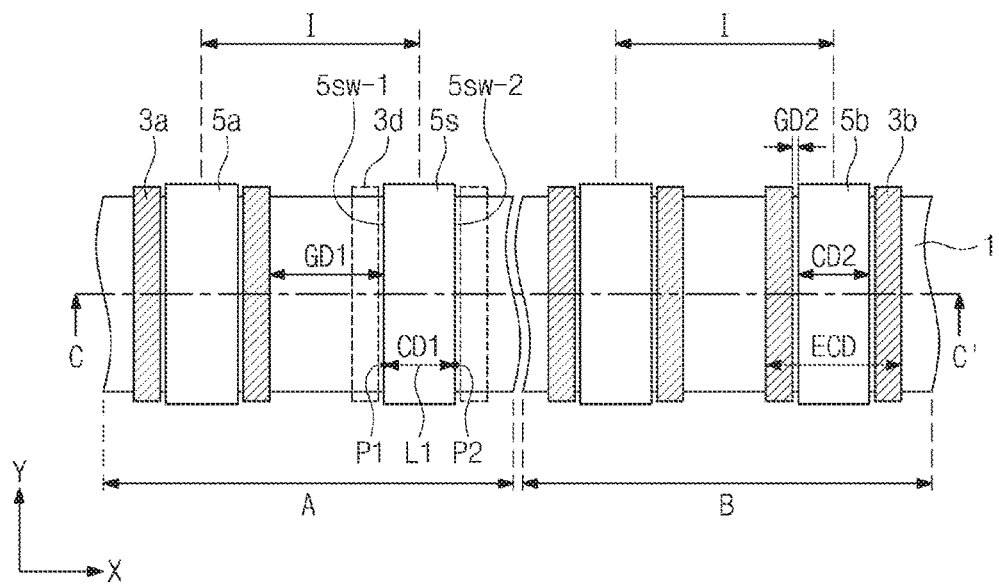
Figure 3B:
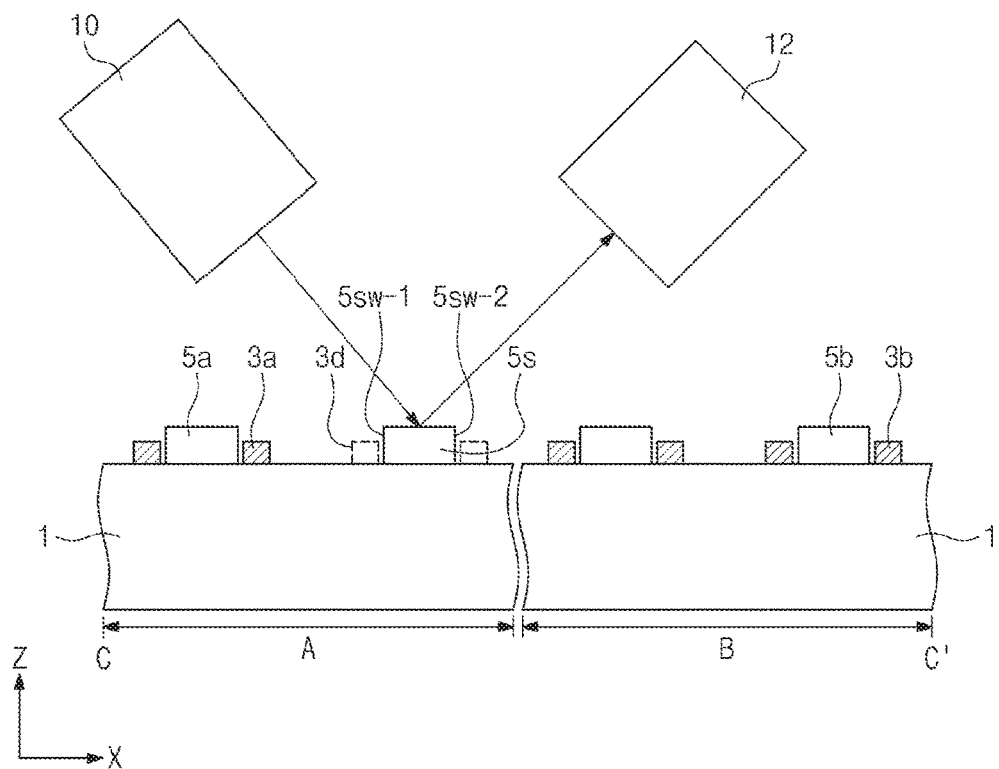

FIG. 1A, FIG. 2A, and FIG. 3A illustrate plan views showing a method of manufacturing a semiconductor device according to some example embodiments of the present inventive concepts. FIG. 1B, FIG. 2B, and FIG. 3B illustrate cross-sectional views taken along lines C-C' of FIG. 1A, FIG. 2A, and FIG. 3A, respectively.

Referring to FIGS. 1A and 1B, a semiconductor substrate 1 may be provided to include a first region A and a second region B. The first region A may be, for example, a dummy region. The second region B may be, for example, a device region. The second region B may be an actual pixel region or an actual cell region where operable cell (memory) patterns are disposed. The first region A may be a dummy region where non-operable dummy patterns are disposed. The first region A may be disposed around the periphery of the second region B. Patterns on the first region A may be formed ("configured") to prevent shapes of device patterns from being distorted due to interference or diffraction of light without being desirably formed at the periphery of the device region in a photolithography process. In addition, dummy patterns may be formed on the first region A to provide central and edge portions of the device region with the same etch condition in an etching process. First dummy patterns 3a and first device patterns 3b may be respectively formed on the first region A and the second region B of the semiconductor substrate 1. The first dummy patterns 3a and the first device patterns 3b may be formed to have the same shape and width. Horizontal distances between the first dummy patterns 3a may be the same as horizontal distances between the first device patterns 3b. The first dummy patterns 3a and the first device patterns 3b may be collectively referred to as a plurality of first patterns on the semiconductor substrate 1.

Referring to FIGS. 2A and 2B, one of the first dummy patterns 3a (e.g., first dummy pattern 3d) may be removed. For example, a removal may be performed on the first dummy patterns 3a adjacent to a second sample dummy pattern ("second sample pattern") (see 5s of FIGS. 3A and 3B) whose critical dimension is measured in a subsequent process. Alternatively, from the beginning when the first dummy patterns 3a are formed in the step of FIGS. 1A and 1B, the first dummy patterns 3a may not be formed on areas adjacent to positions where a second sample dummy pattern 5s ("second sample pattern") is formed in a subsequent process. As referred to herein, a "critical dimension" may be a particular dimension of a pattern, including a length of the pattern in one or more particular direction. In some example embodiments, a "critical dimension" may be a maximum length or a minimum length of a pattern in a particular direction (e.g., greatest width, smallest width, etc.).

Referring to FIGS. 3A and 3B, second dummy patterns 5a and second device patterns 5b having the same shape and width (e.g., having a common shape and width) may be respectively formed on the first region A and the second region B of the semiconductor substrate 1 (e.g., the dummy region A and the device region B of the semiconductor substrate 1). The second dummy patterns 5a and the second device pattern 5b may be collectively referred to as a plurality of second patterns on the semiconductor substrate 1, such that the plurality of first patterns and the plurality of second patterns are on both the dummy region A and the device region B of the semiconductor substrate 1. Horizontal distances between the second dummy patterns 5a may be the same as horizontal distances between the second device patterns 5b. At least one second dummy pattern of the second dummy patterns 5a may be called an at least one second sample dummy pattern 5s ("second sample pattern") that is dedicated to (e.g., configured to be utilized to enable) measuring a critical dimension associated with the plurality of second patterns, such that the second dummy patterns 5a, the second device patterns 5b, and the at least one second sample dummy pattern 5s have the same shape and width (a common shape and width). As shown in FIG. 3A, the second patterns (second device patterns 5b and second dummy patterns 5a) may be horizontally spaced apart at an equal interval "I" from the at least one second sample pattern (second sample dummy pattern 5s). One second dummy pattern 5a may be formed, for example, between two neighboring ("adjacent," "nearest," etc.) first dummy patterns 3a. Such two adjacent first dummy patterns 3a may each be referred to as an adjacent first dummy pattern 3a in relation to the one second dummy pattern 5a. One second device pattern 5b may be formed, for example, between two neighboring first device patterns 3b. Such two adjacent first device patterns 3b may each be referred to as an adjacent first device pattern 3b in relation to the one second device pattern 5b. In contrast, the second device pattern 5b may not be disposed between other two neighboring first device patterns 3b. Two first device patterns 3b may be disposed between two neighboring second device patterns 5b. Accordingly, the second device pattern 5b may be disposed between every second pair of the first device patterns 3b. The second sample dummy pattern 5s may be formed between positions where the first dummy patterns 3d are removed. The second sample dummy pattern 5s may not adjoin, nor vertically overlap, but be far away from the first dummy patterns 3a.

The second sample dummy pattern 5s may be used to measure a first critical dimension CD1 associated with the second sample dummy pattern 5s, and thus a critical dimension associated with the plurality of second patterns, to recognize whether or not the second dummy and device patterns 5a and 5b are formed to have their actually desired critical dimensions. For example, a light emitted from a light source 10 may be irradiated on and reflected from a surface of the semiconductor substrate 1, and the reflected light may be transmitted to a light detection 12 ("light detector," "light sensor," etc.), which may thereby acquire an image. The acquired image may be employed to measure the first critical dimension CD1 of the second sample dummy pattern 5s. For example, the image may be employed to measure a distance between first and second points P1 and P2 that are respectively provided on facing first and second sidewalls 5sw-1 and 5sw-2 of the second sample dummy pattern 5s. Since the second sample dummy pattern 5s is far away from the first dummy patterns 3a, and the plurality of first patterns thus may exclude any first patterns 3a, 3b, 3d, etc. between the second sample dummy pattern 5s and an adjacent second pattern 5a and/or 5b of the plurality of second patterns in relation to the second sample dummy pattern 5s in a particular direction, the first critical dimension CD1 may be accurately measured. The first critical dimension CD1 of the second sample dummy pattern 5s may be substantially the same as a second critical dimension CD2 of the second device pattern 5b. When the second device pattern 5b is used to measure the second critical dimension CD2 in the step of FIG. 3A, an error critical dimension ECD may be obtained due to the first device pattern 3b that is adjacent to the second device pattern 5b. A possibility of error occurrence may increase as semiconductor devices are highly integrated. According to some example embodiments, the first critical dimension CD1 may be accurately measured, based on the absence of any adjacent first pattern 3d in relation to the second sample dummy pattern 5s such that a highly reliable semiconductor device may be manufactured. After the first critical dimension CD1 is accurately measured, the first critical dimension CD1 may be determined whether or not within an allowable critical dimension range.

The second sample dummy pattern 5s and its most adjacent first dummy pattern 3a (e.g., an adjacent first pattern of the plurality of first patterns in relation to the second sample dummy pattern 5s) may be spaced apart at a first horizontal distance GD1 of more than about 100 nm in a direction parallel to a line L1 connecting the first point P1 and the second point P2 (e.g., the X direction). The first horizontal distance GD1 may be greater than a second horizontal distance GD2 between one second pattern 5b of the second device patterns 5b and its most adjacent first device pattern 3b (e.g., an adjacent first pattern 3b of the plurality of first patterns in relation to the one second pattern 5b) in the direction parallel to a line connecting the first point P1 and the second point P2 (e.g., the X direction).

As shown below in at least FIG. 16A, a second sample dummy pattern 5s may include a plurality of sub-sample dummy patterns (also referred to as "sub-sample patterns" with regard to a second sample pattern) that are adjacent to each other.

Figure 4:
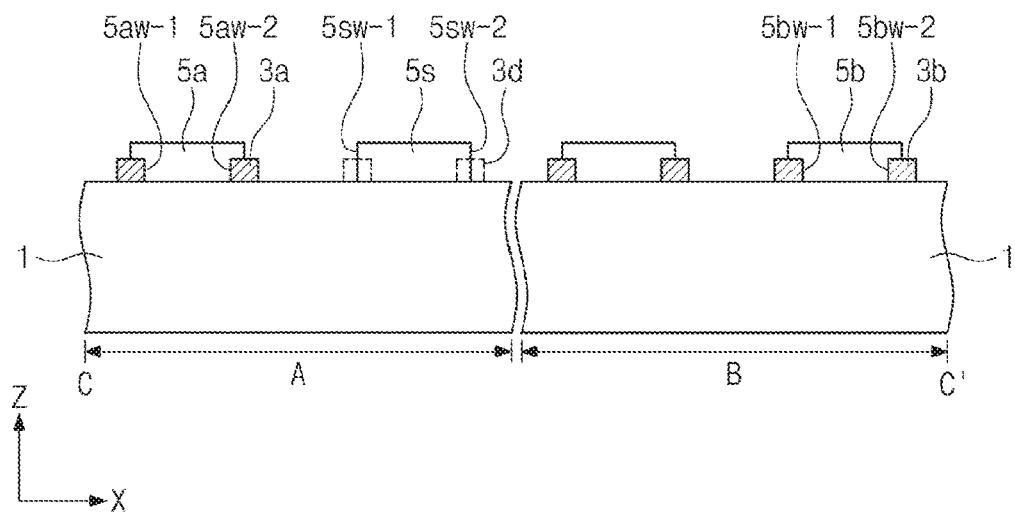
FIG. 4 illustrates a cross-sectional view showing a semiconductor device according to some example embodiments of the present inventive concepts.

FIG. 4 illustrates a cross-sectional view showing a semiconductor device according to some example embodiments of the present inventive concepts.

Referring to FIG. 4, the second dummy patterns 5a and the second device patterns 5b may be formed ("configured") to come into contact with the first dummy patterns 3a and the first device patterns 3b, respectively (e.g., the first patterns may be in contact with separate, respective second patterns). As shown in FIG. 4, the second dummy patterns 5a may have upper edges that partially cover top surfaces of the first dummy patterns 3a, and likewise the second device patterns 5b may have upper edges that partially cover top surfaces of the first device patterns 3b. Since the second sample dummy pattern 5s are formed on positions where the first dummy patterns 3d are removed ("omitted," "absent," "excluded," etc.), the second sample dummy pattern 5s may not be in contact with any first dummy patterns 3a. Other process steps may be identical or similar to those discussed above.

Figure 5:
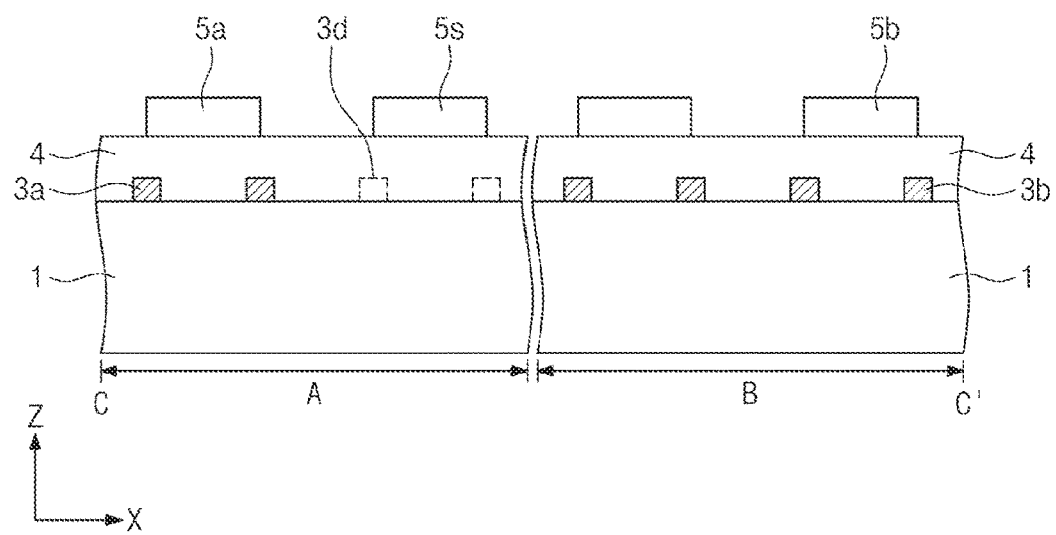
FIG. 5 illustrates a cross-sectional view showing a semiconductor device according to some example embodiments of the present inventive concepts.

FIG. 5 illustrates a cross-sectional view showing a semiconductor device according to some example embodiments of the present inventive concepts.

Referring to FIG. 5, an interlayer dielectric layer 4 may be formed on the semiconductor substrate 1 in the state of FIG. 2B. The second dummy patterns 5a, the second sample dummy pattern 5s, and the second device patterns 5b may be formed on the interlayer dielectric layer 4. In the case that the interlayer dielectric layer 4 includes a transparent material, when the second dummy pattern 5a is used to measure its critical dimension (e.g., the critical dimension of the second dummy pattern 5a), the first dummy pattern 3a may be caused to measure an error critical dimension based on the second dummy pattern 5a vertically overlapping the first dummy pattern 3a. To enable accurate measurement of a critical dimension associated with the second patterns, the second sample dummy pattern 5s may be formed on positions where the first dummy patterns 3d are removed. As such, the critical dimension of the second sample dummy pattern 5s may be accurately measured based on the absence of the first dummy patterns 3d. Other process steps may be identical or similar to those discussed above.

Figure 6:
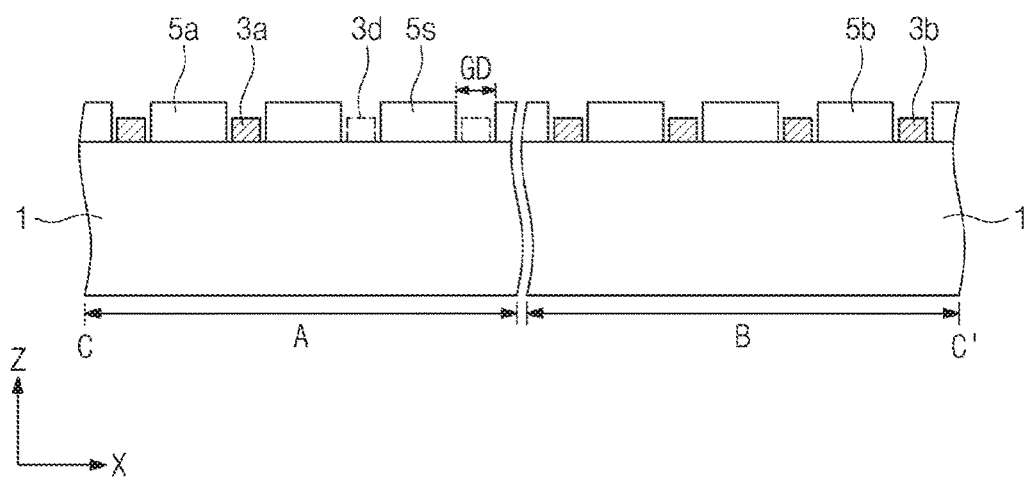
FIG. 6 illustrates a cross-sectional view showing a semiconductor device according to some example embodiments of the present inventive concepts.

FIG. 6 illustrates a cross-sectional view showing a semiconductor device according to some example embodiments of the present inventive concepts.

Referring to FIG. 6, the second dummy patterns 5a may be formed between the first dummy patterns 3a. The second device patterns 5b may be formed between the first device patterns 3b. One first device pattern 3b may be disposed between two neighboring second device patterns 5b. One first dummy pattern 3a may be disposed between two neighboring second dummy patterns 5a. The first dummy pattern 3a may not adjoin the second sample dummy pattern 5s. For example, the first dummy pattern 3a may not be disposed between the second sample dummy pattern 5s and the second dummy pattern 5a. The second sample dummy pattern 5s and its most adjacent second dummy pattern 5a may be spaced apart from each other at a horizontal distance GD of more than about 100 nm. Other process steps may be identical or similar to those discussed above.

Figure 7:
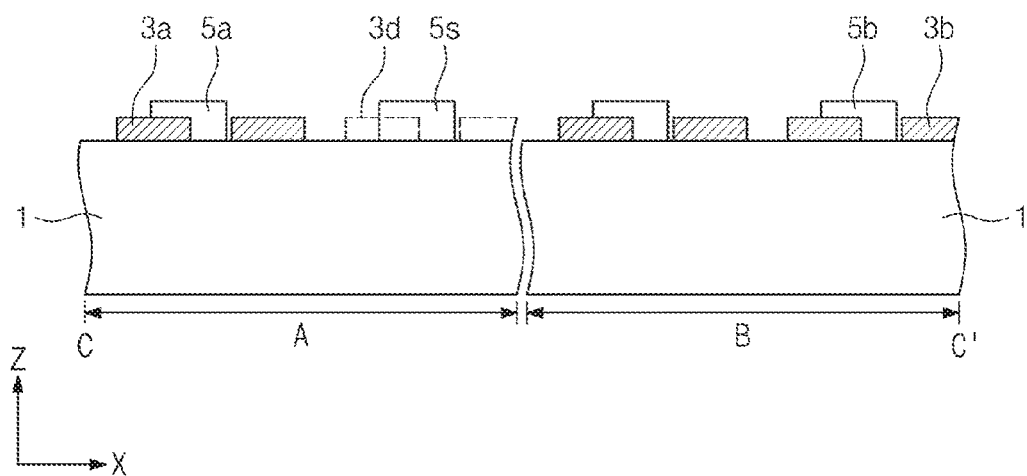
FIG. 7 illustrates a cross-sectional view showing a semiconductor device according to some example embodiments of the present inventive concepts.

FIG. 7 illustrates a cross-sectional view showing a semiconductor device according to some example embodiments of the present inventive concepts.

Referring to FIG. 7, the first dummy patterns 3a and the first device patterns 3b may each be formed to have a width (e.g., length in parallel with the upper surface of the semiconductor substrate 1) greater than that in the case of FIG. 4. As shown in FIG. 7, the second dummy patterns 5a may each be formed to come into contact with and to overlap an end of a corresponding one of the first dummy patterns 3a. The second device patterns 5b may each be formed to come into contact with and to overlap an end of a corresponding one of the first device patterns 3b. The second sample dummy pattern 5s may not adjoin ("contact") nor overlap the first dummy pattern 3a, based on the first dummy pattern 3d having been removed. Other process steps may be identical or similar to those discussed above.

Figure 8A:
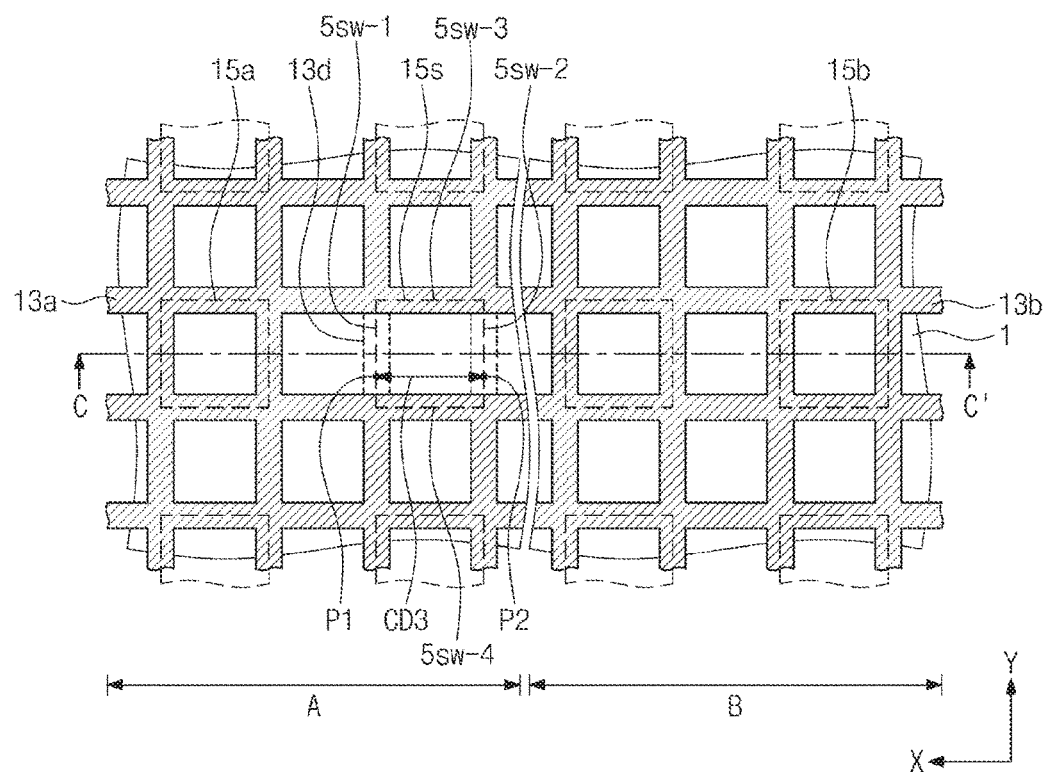
FIG. 8A, FIG. 8B, and FIG. 8C illustrate plan views showing a semiconductor device according to some example embodiments of the present inventive concepts.
Figure 8B:
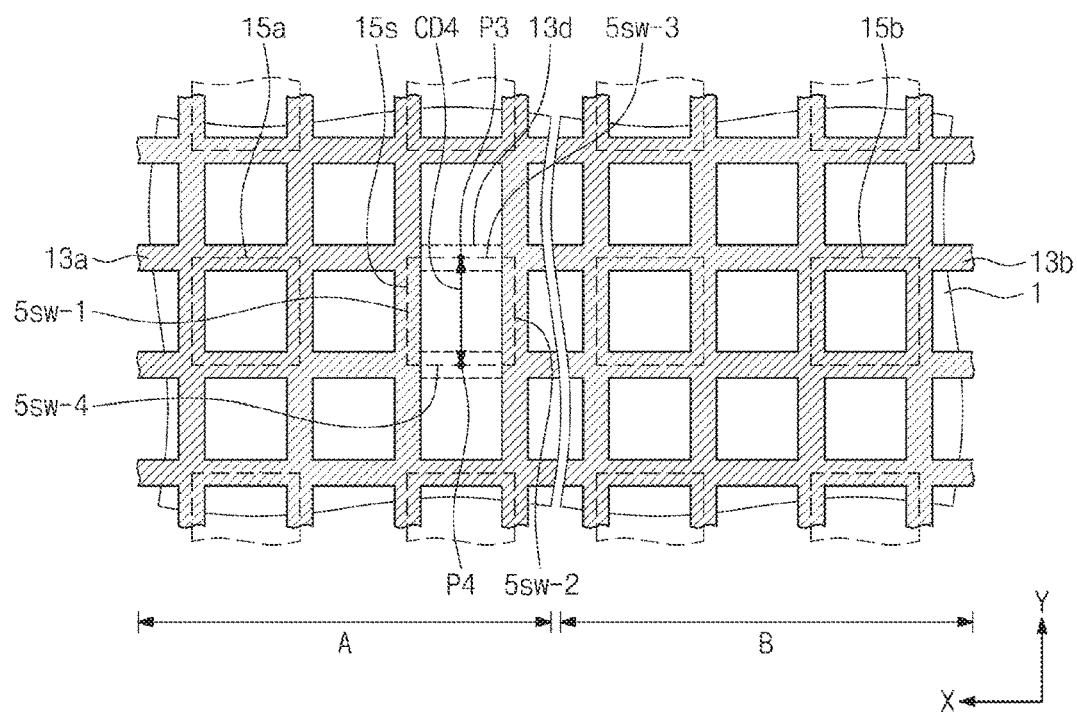
Figure 8C:
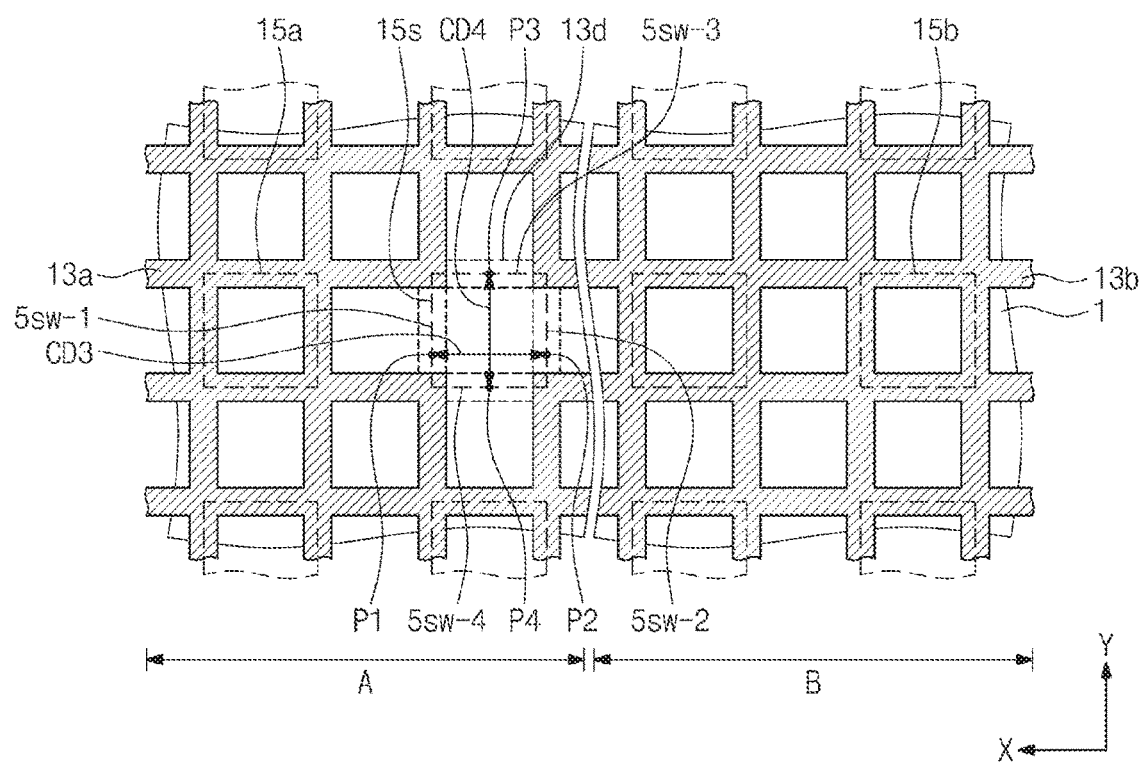

FIG. 8A, FIG. 8B, and FIG. 8C illustrate plan views showing a semiconductor device according to some example embodiments of the present inventive concepts.

Referring to FIG. 8A, a semiconductor substrate 1 including a first region A and a second region B may be provided thereon with first dummy patterns 13a and first device patterns 13b that are connected to each other to constitute a net shape. Second dummy patterns 15a, a second sample dummy pattern 15s, and second device patterns 15b may be provided to have island shapes that are spaced apart from each other. Before the second patterns 15a, 15s, and 15b are formed, a removal of one or more portions of the first dummy patterns 13a (e.g., removal of first dummy patterns 13d) may be performed on the first dummy patterns 13a adjacent to first and second points P1 and P2 where the second sample dummy pattern 15s is used to measure its third critical dimension CD3. The first dummy pattern 13a may form an opening at the position where the second sample dummy pattern 15s is disposed, and the opening may have a bar shape that elongates in a first direction X, in plan view, as shown in FIG. 8A. A cross-sectional view taken along line C-C' of FIG. 8A may correspond to the view illustrated in FIG. 4. As shown in FIG. 4, the second dummy patterns 15a and the second device patterns 15b may have their sidewalls 5aw-1 and 5aw-2, 5bw-1 and 5bw-2, all of which are in contact with the first dummy patterns 13a and the first device patterns 13b, respectively. The second sample dummy pattern 15s may have left and right sides (first and second sidewalls) 5sw-1 and 5sw-2 facing each other in the first direction X that are disposed on positions of the removed first dummy patterns 13d, thereby not being in contact with any of the first dummy patterns 13a. The second sample dummy pattern 15s may have front and rear sides (third and fourth sidewalls) 5sw-3 and 5sw-4 facing each other in a second direction Y that are in contact with the first dummy patterns 13a. The third sidewall 5sw-3 may connect respective first ends of the first and second sidewalls 5sw-1 and 5sw-2, and the fourth sidewall 5sw-4 may connect respective opposite, second ends of the first and second sidewalls 5sw-1 and 5sw-2. In addition, as shown in FIG. 8A, at least one sidewall of the third sidewall 5sw-3 and the fourth sidewall 5sw-4 may be in contact with the plurality of first dummy patterns 13a. Accordingly, the first dummy patterns 13a may not interfere in accurately measuring the third critical dimension CD3, or a distance between the first point P1 and the second point P2. Other process steps may be identical or similar to those discussed with reference to FIG. 4.

Referring to FIG. 8B, before the second patterns 15a, 15s, and 15b are formed, a removal of one or more portions of the first dummy patterns 13a (e.g., removal of first dummy patterns 13d) may be performed on the first dummy patterns 13a adjacent to third and fourth points P3 and P4 where the second sample dummy pattern 15s is used to measure its fourth critical dimension CD4. The first dummy pattern 13a may form an opening at the position where the second sample dummy pattern 15s is disposed, and the opening may have a bar shape that elongates in the second direction Y, in plan view. The second sample dummy pattern 15s may have left and right sides (sidewalls) 5sw-1 and 5sw-2 facing each other in the first direction X that are in contact with the first dummy patterns 13a. The second sample dummy pattern 15s may have front and rear sides (sidewalls) 5sw-3 and 5sw-4 facing in the second direction Y that are disposed on positions of the removed first dummy patterns 13d, thereby not being in contact with any of the first dummy patterns 13a. Accordingly, the first dummy patterns 13a may not interfere in accurately measuring the fourth critical dimension CD4, or a distance between the third point P3 and the fourth point P4. Other process steps may be identical or similar to those discussed with reference to FIG. 4.

Referring to FIG. 8C, before the second patterns 15a, 15s, and 15b are formed, a removal of one or more portions of the first dummy patterns 13a (e.g., removal of first dummy patterns 13d) may be performed on the first dummy patterns 13a adjacent to the first to fourth points P1 to P4 where the second sample dummy pattern 15s is used to measure its third and fourth critical dimensions CD3 and CD4. The first dummy pattern 13a may form an opening at the position where the second sample dummy pattern 15s is disposed, and the opening may have a cross shape, in plan view, as shown in FIG. 8C. As shown in FIG. 8C, the second sample dummy pattern 15s may have four corners that are each in contact with the first dummy patterns 13a. The second sample dummy pattern 15s may have four sides (sidewalls) 5sw-1 to 5sw-4, which are disposed on positions of the removed first dummy patterns 13d and are not in contact with the first dummy patterns 13a. Accordingly, the first dummy patterns 13a may not interfere in accurately measuring the third and fourth dimensions CD3 and CD4. Other process steps may be identical or similar to those discussed with reference to FIG. 4.

The following is a description of a method of manufacturing an image sensor according to some example embodiments of the present inventive concepts.

FIG. 9A, FIG. 10A, FIG. 11A, FIG. 12A, FIG. 13A, and FIG. 14A illustrate plan views showing a method of manufacturing an image sensor according to some example embodiments of the present inventive concepts. FIG. 9B, FIG. 10B, FIG. 11B, FIG. 12B, FIG. 13B, and FIG. 14B illustrate cross-sectional views taken along lines D-D' and E-E' of FIG. 9A, FIG. 10A, FIG. 11A, FIG. 12A, FIG. 13A, and FIG. 14A, respectively.

Figure 9A:
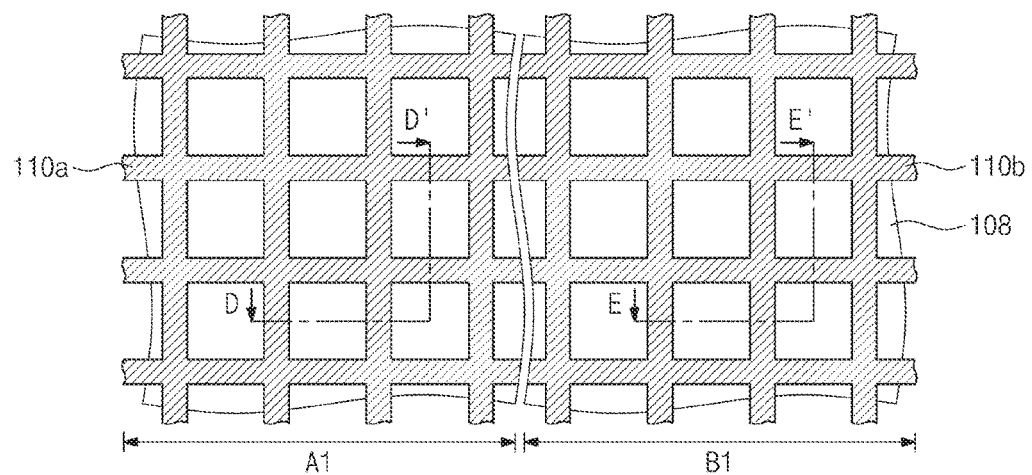
FIG. 9A, FIG. 10A, FIG. 11A, FIG. 12A, FIG. 13A, and FIG. 14A illustrate plan views showing a method of manufacturing an image sensor according to some example embodiments of the present inventive concepts.
Figure 9B:
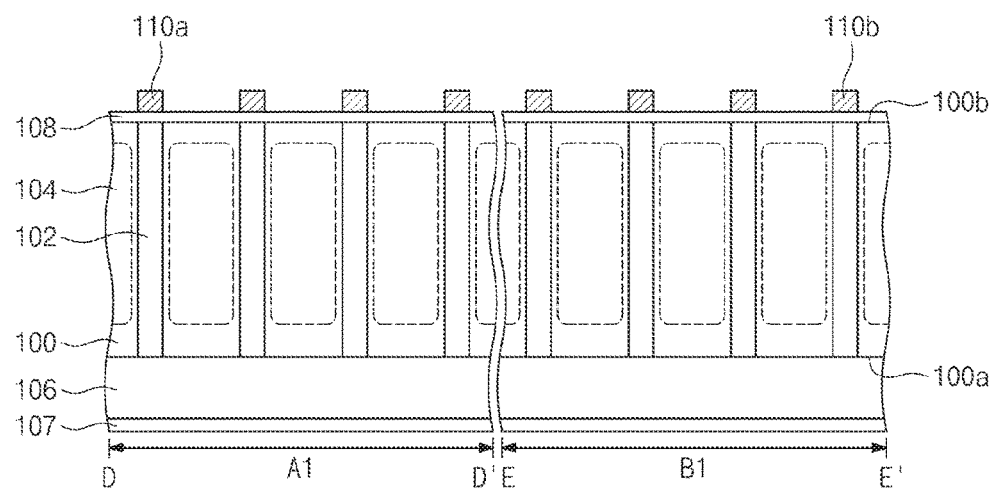
FIG. 9B, FIG. 10B, FIG. 11B, FIG. 12B, FIG. 13B, and FIG. 14B illustrate cross-sectional views taken along lines D-D' and E-E' of FIG. 9A, FIG. 10A, FIG. 11A, FIG. 12A, FIG. 13A, and FIG. 14A, respectively.

Referring to FIGS. 9A and 9B, a semiconductor substrate 100 may be provided. The semiconductor substrate 100 may include a dummy pixel region A1 and an actual pixel region B1. The dummy pixel region A1 may be disposed around the periphery of the actual pixel region B1. For example, the dummy pixel region A1 may surround the actual pixel region B1. The semiconductor substrate 100 may have a first surface 100a and a second surface 100b facing each other. The semiconductor substrate 100 may be doped with a first conductive type impurity. A deep device isolation section 102 may be formed in the semiconductor substrate 100, and thus the semiconductor substrate 100 may be separated into a plurality of unit pixel regions. The dummy pixel region A1 and the actual pixel region B1 may each be provided with a plurality of the unit pixel regions. The deep device isolation section 102 may have a bottom surface spaced apart from the second surface 100b. The deep device isolation section 102 may be formed by etching the semiconductor substrate 100 to form a deep trench, filling the deep trench with an insulating material, and performing a planarization process on the insulating material. The deep device isolation section 102 may include at least one of a silicon oxide layer, a silicon nitride layer, and a silicon oxynitride layer. The deep device isolation section 102 may be formed to have a net shape, in plan view, as shown in at least FIG. 9A.

An ion implantation process may be performed to inject a second conductive type impurity, opposite the first conductive type impurity, into the semiconductor substrate 100 including the unit pixel regions that are separated by the deep device isolation section 102, thereby forming a photoelectric conversion section 104. A plurality of transistors (not shown), a plurality of connection lines (not shown), and an interlayer dielectric layer 106 may be formed on the first surface 100a of the semiconductor substrate 100. A passivation layer 107 may be formed on the interlayer dielectric layer 106. The interlayer dielectric layer 106 may be formed of, for example, a silicon oxide layer or a porous insulation layer. The passivation layer 107 may be formed of, for example, a silicon nitride layer.

A grinding process may be performed to remove portions adjacent to the second surface 100b of the semiconductor substrate 100, and thus the deep device isolation section 102 may be exposed. A backside layer 108 may be formed on the second surface 100b of the semiconductor substrate 100. The backside layer 108 may include a fixed charge layer, an antireflection layer, and/or a planarization layer. The fixed charge layer may include metal oxide or metal fluoride that includes at least one metal selected from group consisting of hafnium (Hf), zirconium (Zr), aluminum (Al), tantalum (Ta), titanium (Ti), yttrium (Y), and lanthanoid. The antireflection layer may be formed of, for example, a silicon nitride layer. The planarization layer may be formed of, for example, a silicon oxide layer or a photoresist layer with no pigment. Dummy light-shield patterns 110a and actual light-shield patterns 110b may be formed on the backside layer 108. The dummy light-shield patterns 110a may be disposed on the dummy pixel region A1. The actual light-shield patterns 110b may be disposed on the actual pixel region B1. The dummy light-shield patterns 110a and the actual light-shield patterns 110b may be connected to each other to constitute a net shape. The light-shield patterns 110a and 110b may include, for example, tungsten. The light-shield patterns 110a and 110b may prevent an undesired light from entering a neighboring unit pixel region, thereby inhibiting crosstalk between the unit pixel regions.

Figure 10A:
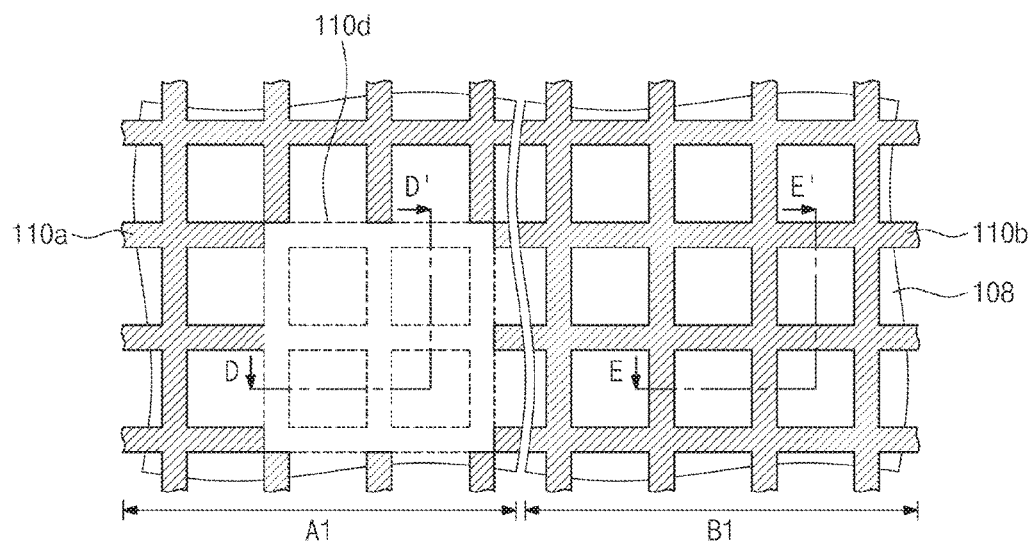
Figure 10B:
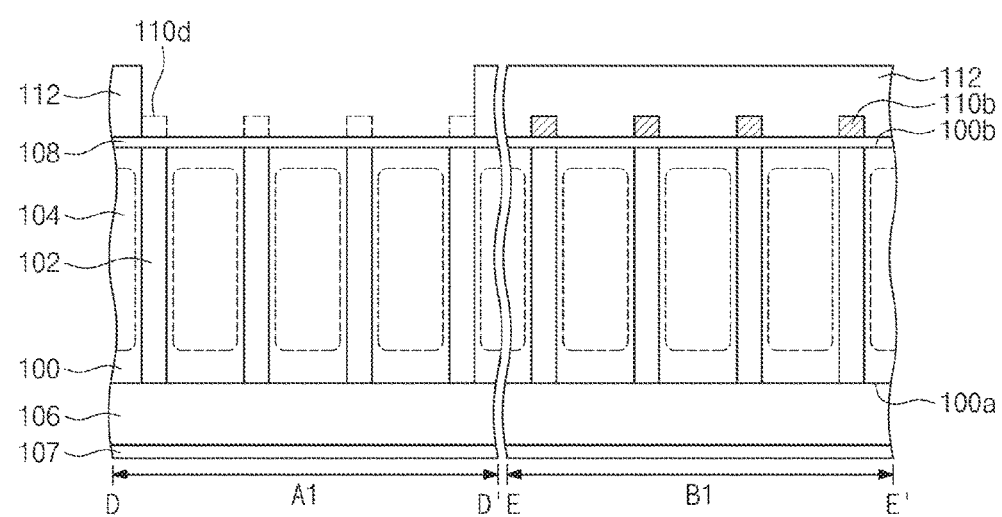

Referring to FIGS. 10A and 10B, a mask pattern 112 may be formed on the backside layer 108 to completely cover the actual light-shield patterns 110b and to partially cover the dummy light-shield patterns 110a. The mask pattern 112 may expose the dummy light-shield patterns 110a adjacent to positions where sample dummy color filters 114s, 116s, and 118s are formed in subsequent processes. A process may be performed to remove the dummy light-shield pattern 110a exposed through the mask pattern 112. The removed dummy light-shield patterns 110d may have a shape in which, for example, four rectangles are coupled to each other, in plan view. The mask pattern 112 may be removed to expose the light-shield patterns 110a and 110b.

Alternatively, from the beginning when the dummy light-shield patterns 110a are formed in the step of FIGS. 9A and 9B, the dummy light-shield patterns 110a may not be formed on areas adjacent to positions where sample dummy color filters 114s, 116s, and 118s are formed in subsequent processes.

Figure 11A:
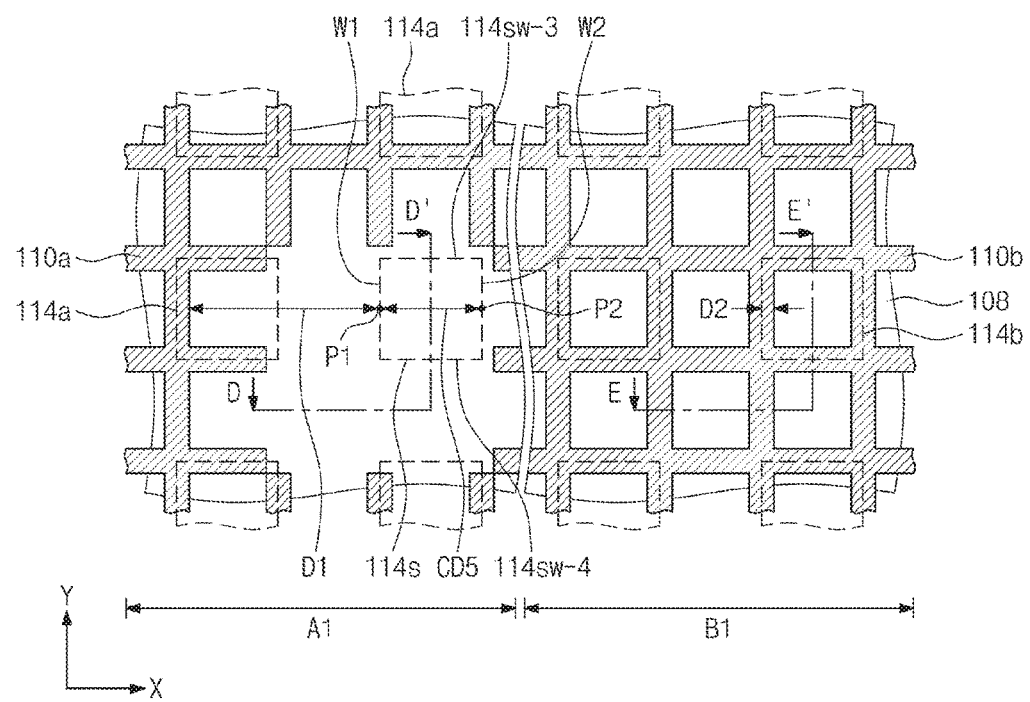
Figure 11B:
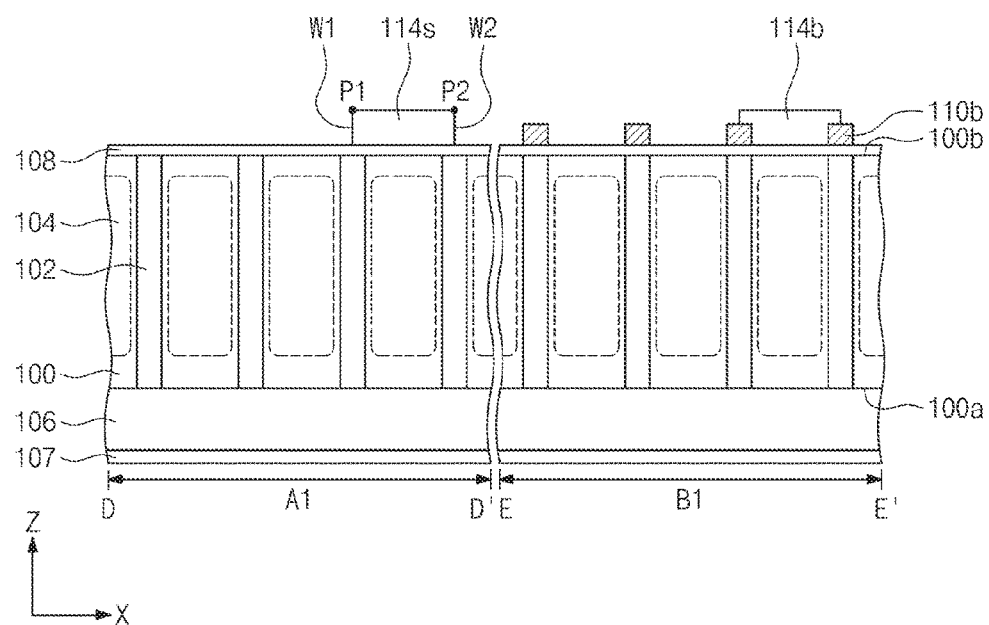

Referring to FIGS. 11A and 11B, first dummy color filters 114a, first sample dummy color filters 114s, and first actual color filters 114b may be formed on the backside layer 108. The first dummy color filters 114a, the first sample dummy color filters 114s, and the first actual color filters 114b may be formed of ("at least partially comprise") a photoresist pattern including a pigment or dye having a first color. The first dummy color filters 114a, the first sample dummy color filters 114s, and the first actual color filters 114b may be formed to have island shapes spaced apart from each other. The first sample dummy color filter 114s may be formed to be spaced apart from the dummy light-shield patterns 110a. As shown in FIGS. 11A-11B, the first sample dummy color filter 114s may include a first sidewall W1, a second sidewall W2 facing the first sidewall W1, a first point P1 on the first sidewall W1, and a second point P2 on the second sidewall W1. The first sample dummy color filter 114s may also have front and rear sidewalls 114sw-3 and 114sw-4 facing each other. The third sidewall 114sw-3 may connect respective first ends of the first and second sidewalls W1 and W2, and the fourth sidewall 114sw-4 may connect respective opposite, second ends of the first and second sidewalls W1 and W2. In some example embodiments, including the example embodiments illustrated in FIG. 16A below and in FIG. 8A above, at least one sidewall of the third sidewall 114sw-3 and the fourth sidewall 114sw-4 may be in contact with the plurality of dummy light-shield patterns 110a. For example, the first sample dummy color filter 114s may be formed on positions where the dummy light-shield patterns 110a are removed. After the first dummy color filters 114a, the first sample dummy color filters 114s, and the first actual color filters 114b are formed, an image of a surface of the semiconductor substrate 100 may be obtained to measure a fifth critical dimension CD5 of the first sample dummy color filter 114s. At this step, the fifth critical dimension CD5 may be accurately measured without interference of the dummy light-shield patterns 110a. At the position where a critical dimension (e.g., the fifth critical dimension CD5) is measured, a first horizontal distance D1 between the first sample dummy color filter 114s and its most adjacent dummy light-shield pattern 110a (e.g., an adjacent dummy light-shield pattern 110a of a plurality of dummy light-shield patterns 110a in relation to the first sample dummy color filter 114s) in a first direction (e.g., the X direction in FIG. 11A) may be greater than a second horizontal distance D2 between one first actual color filter 114b of the first actual color filters 114b and its most adjacent actual light-shield pattern 110b (e.g., an adjacent actual light-shield pattern 110b of a plurality of actual light-shield patterns in relation to the one first actual color filter 114b). The first sample dummy color filter 114s may be spaced apart in the first direction X from an adjacent dummy light-shield pattern 110a of the plurality of dummy light-shield patterns 110a in relation to the first sample dummy color filter 114s at a horizontal distance of more than about 100 nm. As referred to herein, "about" or "substantially" a given value (e.g., 100 nm) may be understood to include a range of values within a particular margin of the given value. For example, "about" or "substantially" a given value (e.g., 100 nm) may be understood to include a range of values within 10% of the given value (e.g., "about" 100 nm may be understood to include any values within a range of 90-110 nm).

Figure 12A:
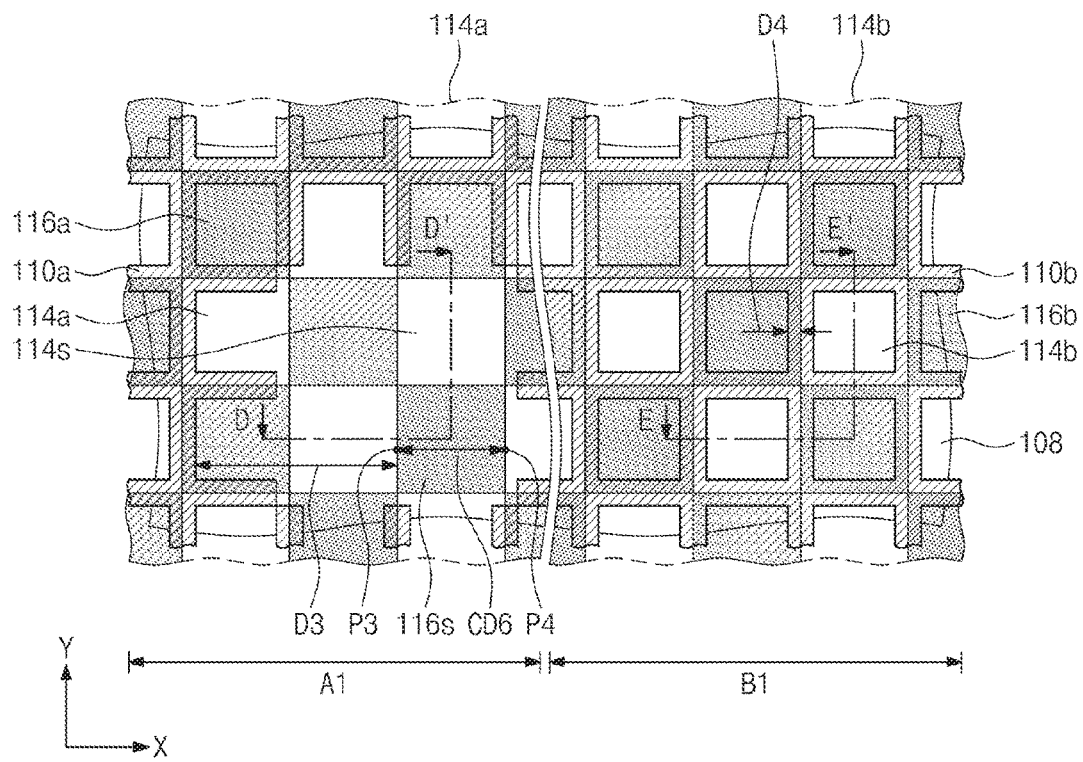
Figure 12B:
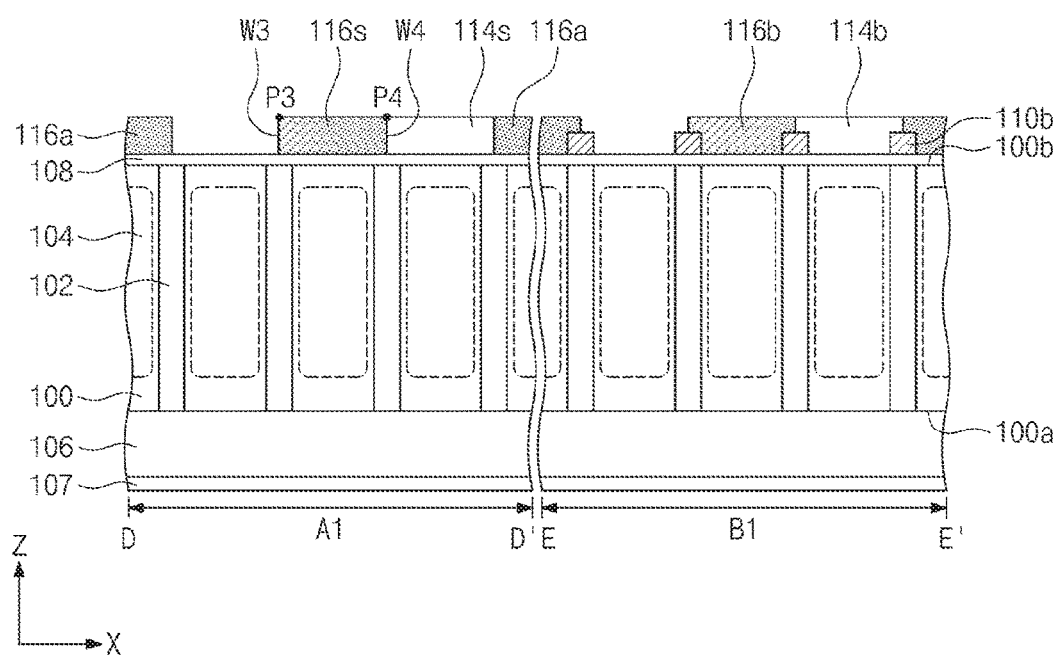

Referring to FIGS. 12A and 12B, second dummy color filters 116a, second sample dummy color filters 116s, and second actual color filters 116b may be formed on the backside layer 108. The second dummy color filters 116a, the second sample dummy color filters 116s, and the second actual color filters 116b may be formed of a photoresist pattern including a pigment or dye having a second color different from the first color. The second dummy color filters 116a, the second sample dummy color filters 116s, and the second actual color filters 116b may be formed to have corners that are in contact with each other. The second color filters 116a, 116s, and 116b may have their opposite sidewalls in contact with the first color filters 114a, 114s, and 114b. As shown in FIGS. 12A-12B, the second sample dummy color filter 116s may include a third sidewall W3, a fourth sidewall W4 facing the third sidewall, a third point P3 on the third sidewall W3, and a fourth point P4 on the fourth sidewall W4. The second sample dummy color filter 116s may be formed spaced apart from the dummy light-shield patterns 110a, such that the second sample dummy color filter 116s and an adjacent dummy light-shield pattern 110a of the plurality of dummy light-shield patterns 110a in relation to the second sample dummy color filter 116s are spaced apart from each other at a third horizontal distance D3 in a second direction (e.g., the X direction in FIG. 12A) parallel to a line connecting a third point P3 and a fourth point P4, the third horizontal distance D3 greater than a fourth horizontal distance D4 in the second direction between one second actual color filter 116b of the plurality of second actual color filters 116b and an adjacent actual light-shield pattern 110b of the plurality of actual light-shield patterns 110b in relation to the one second actual color filter 116b. For example, the second sample dummy color filter 116s may be formed on positions where the dummy light-shield patterns 110a are removed. After the second dummy color filters 116a, the second sample dummy color filters 116s, and the second actual color filters 116b are formed, an image of the surface of the semiconductor substrate 100 may be obtained to measure a sixth critical dimension CD6 of the second sample dummy color filter 116s. At this step, the sixth critical dimension CD6 may be accurately measured without interference of the dummy light-shield patterns 110a. At the position where a critical dimension (e.g., the sixth critical dimension CD6) is measured, a horizontal distance between the second sample dummy color filter 116s and its most adjacent dummy light-shield pattern 110a may be greater than a horizontal distance between one of the second actual color filters 116b and its most adjacent actual light-shield pattern 110b.

Figure 13A:
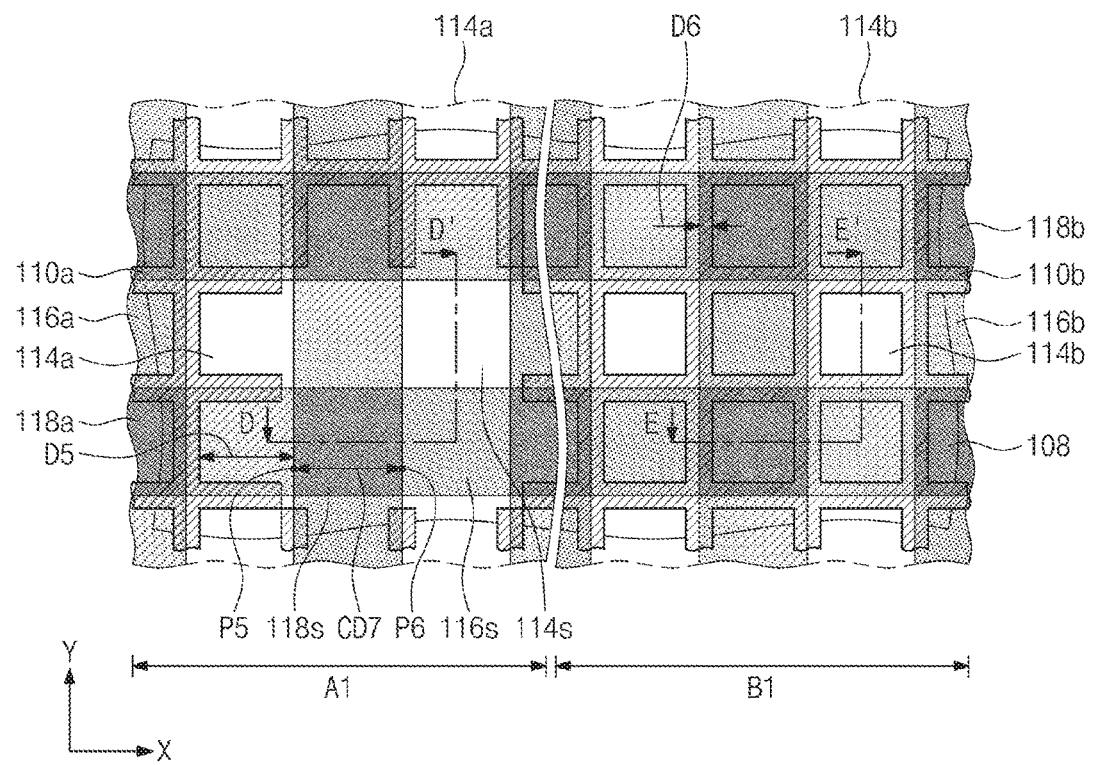
Figure 13B:
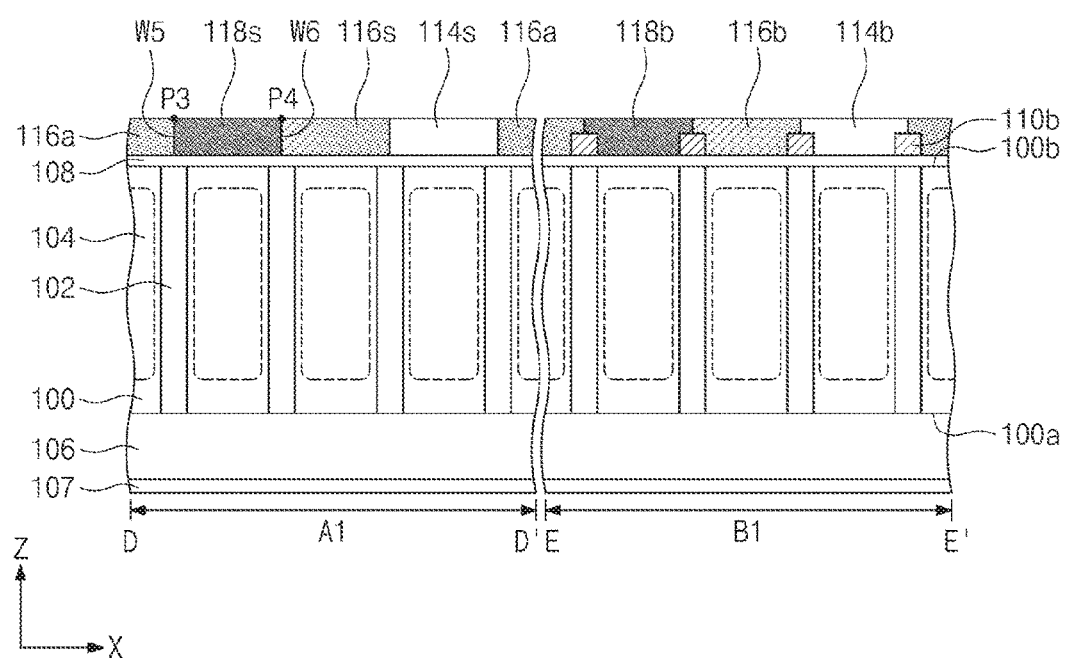

Referring to FIGS. 13A and 13B, third dummy color filters 118a, third sample dummy color filters 118s, and third actual color filters 118b may be formed on the backside layer 108. The third dummy color filters 118a, the third sample dummy color filters 118s, and the third actual color filters 118b may be formed of a photoresist pattern including a pigment or dye having a third color different from the first and second colors. The third dummy color filters 118a, the third sample dummy color filters 118s, and the third actual color filters 118b may be formed to have island shapes spaced apart from each other. As shown in FIGS. 13A-13B, the third sample dummy color filter 118s may include a fifth sidewall W5, a sixth sidewall W6 facing the fifth sidewall, a fifth point P1 on the fifth sidewall W5, and a sixth point P6 on the sixth sidewall W6. The third color filters 118a, 118s, and 118b may have their four sides in contact with the second color filters 116a, 116s, and 116b. The third sample dummy color filter 118s may be formed spaced apart from the dummy light-shield patterns 110a, such that the third sample dummy color filter 118s and an adjacent dummy light-shield pattern 110a of the plurality of dummy light-shield patterns 110a in relation to the third sample dummy color filter 118s are spaced apart from each other at a fifth horizontal distance D5 in a third direction (e.g., the X direction in FIG. 13A) parallel to a line connecting the fifth point and the sixth point, the fifth horizontal distance D5 greater than a sixth horizontal distance D6 in the third direction between one third actual color filter 118b of the plurality of third actual color filters 118b and an adjacent actual light-shield pattern 110b of the plurality of actual light-shield patterns 110b in relation to the one third actual color filter 118b. After the third dummy color filters 118a, the third sample dummy color filters 118s, and the third actual color filters 118b are formed, an image of the surface of the semiconductor substrate 100 may be obtained to measure a seventh critical dimension CD7 of the third sample dummy color filter 118s. At this step, the seventh critical dimension CD7 maybe accurately measured without interference of the dummy light-shield patterns 110a. At the position where a critical dimension (e.g., the seventh critical dimension CD7) is measured, a horizontal distance between the third sample dummy color filter 118s and its most adjacent dummy light-shield pattern 110a may be greater than a horizontal distance between one of the third actual color filters 118b and its most adjacent actual light-shield pattern 110b.

In some example embodiments, the first sample dummy color filters 114s, the second sample dummy color filters 116s, and the third sample dummy color filters 118s have different colors from each other. As shown in FIG. 13A, one sample dummy color filter of the first sample dummy color filters 114s, the second sample dummy color filters 116s, and the third sample dummy color filters 118s (e.g., in FIG. 14A a second sample dummy color filter 116s) may include a plurality of sidewalls that are adjacent to a remainder plurality of sample dummy color filters of the first sample dummy color filter 114s, the second sample dummy color filter 116s, and the third sample dummy color filters 118s.

Figure 14A:
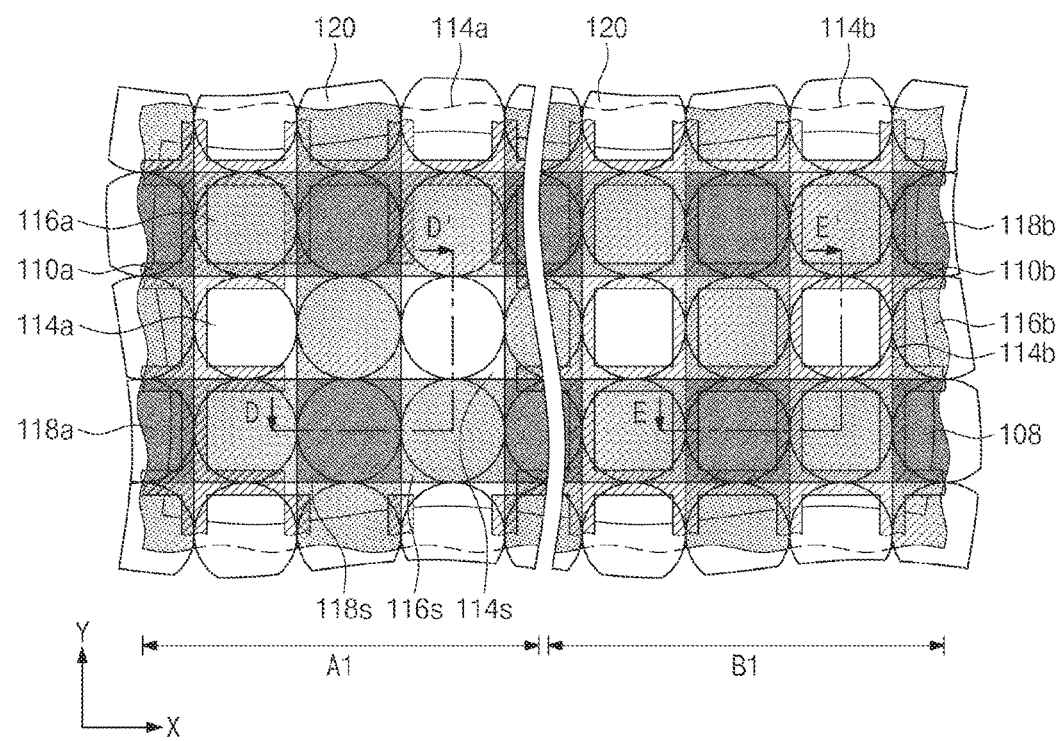
Figure 14B:
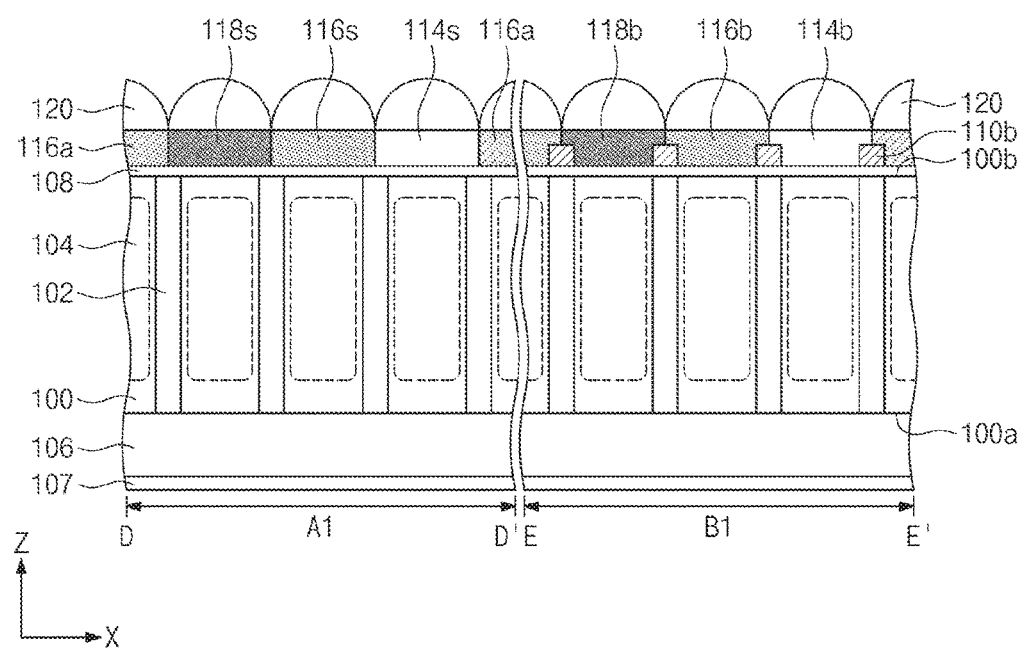

Referring to FIGS. 14A and 14B, micro-lenses 120 may be formed on the color filters 114a, 114s, 114b, 116a, 116s, 116b, 118a, 118s, and 118b. The micro-lenses 120 may be formed by performing a reflow process after forming transparent photoresist patterns.

The aforementioned processes may manufacture a highly reliable image sensor.

In the image sensor illustrated in FIGS. 14A and 14B, on the dummy pixel region A1, the sample dummy color filters 114s, 116s, and 118s may not be in contact with the dummy light-shield patterns 110a. In contrast, on the dummy pixel region A1, the dummy light-shield patterns 110a may be in contact with the dummy color filters 114a, 116a, and 118a whose critical dimensions are not measured. In addition, on the actual pixel region B1, the actual color filters 114b, 116b, and 118b may be in contact with the actual light-shield patterns 110b.

FIG. 15A, FIG. 16A, FIG. 17A, and FIG. 18A illustrate plan views showing a method of manufacturing an image sensor according to some example embodiments of the present inventive concepts. FIG. 15B, FIG. 16B, FIG. 17B, and FIG. 18B illustrate cross-sectional views taken along lines F-F' and G-G' of FIG. 15A, FIG. 16A, FIG. 17A, and FIG. 18A, respectively.

Figure 15A:
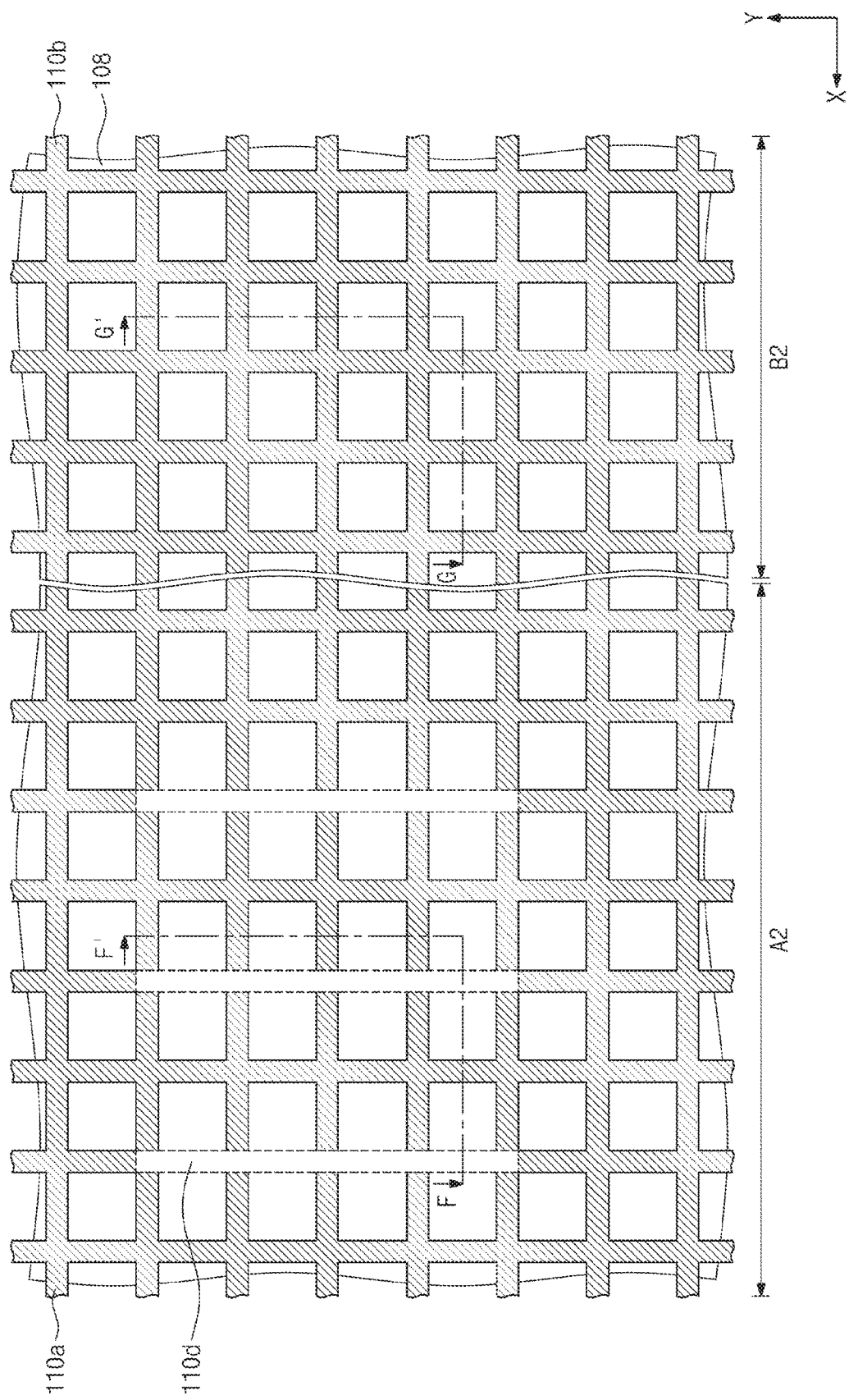
Figure 15B:
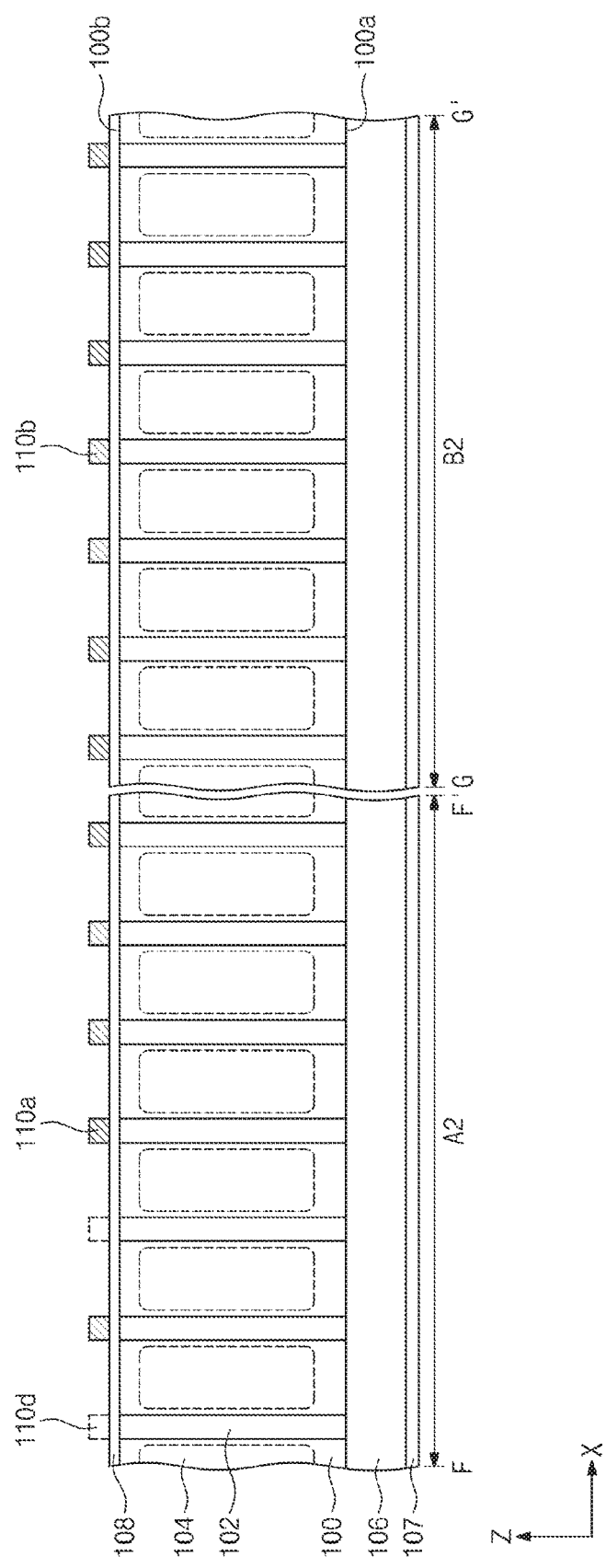
FIG. 15B, FIG. 16B, FIG. 17B, and FIG. 18B illustrate cross-sectional views taken along lines F-F' and G-G' of FIG. 15A, FIG. 16A, FIG. 17A, and FIG. 18A, respectively.

Referring to FIGS. 15A and 15B, a semiconductor substrate 100 may be provided. The semiconductor substrate 100 may include a dummy pixel section A2 and an actual pixel section B2. An explanation of the semiconductor substrate 100 may be identical or similar to that discussed with reference to FIGS. 9A and 9B. A deep device isolation section 102 and a photoelectric conversion section 104 may be formed inside the semiconductor substrate 100. A plurality of transistors (not shown), a plurality of connection lines (not shown), and an interlayer dielectric layer 106 may be formed on a first surface 100a of the semiconductor substrate 100. A passivation layer 107 may be formed on the interlayer dielectric layer 106. A backside layer 108 may be formed on a second surface 100b of the semiconductor substrate 100. The backside layer 108 may include a fixed charge layer, an antireflection layer, and/or a planarization layer. Dummy light-shield patterns 110a and actual light-shield patterns 110b may be formed on the backside layer 108. The dummy light-shield patterns 110a may be disposed on the dummy pixel region A2. The actual light-shield patterns 110b may be disposed on the actual pixel region B2. The dummy light-shield patterns 110a and the actual light-shield patterns 110b may be connected to each other to constitute a net shape. A mask pattern (not shown) may be used to partially remove the dummy light-shield patterns 110a adjacent to positions where sample dummy color filters 114s, 116s, and 118s are formed in subsequent processes. For example, according to some embodiments, the dummy light-shield patterns 110a may be partially removed from positions where sample dummy color filters 114s, 116s, and 118s are used to measure their critical dimensions in subsequent processes. The removed dummy light-shield patterns 110*d* may have a bar shape that elongates in a second direction Y, in plan view. The removed dummy light-shield patterns 110*d* may be provided therebetween the dummy light-shield patterns 110*a* that are not removed.

Alternatively, from the beginning when the dummy light-shield patterns 110*a* are formed in the step of FIGS. 15A and 15B, the dummy light-shield patterns 110*a* may not be formed on areas adjacent to positions where sample dummy color filters 114*s*, 116*s*, and 118*s* are formed in subsequent processes.

Figure 16B:
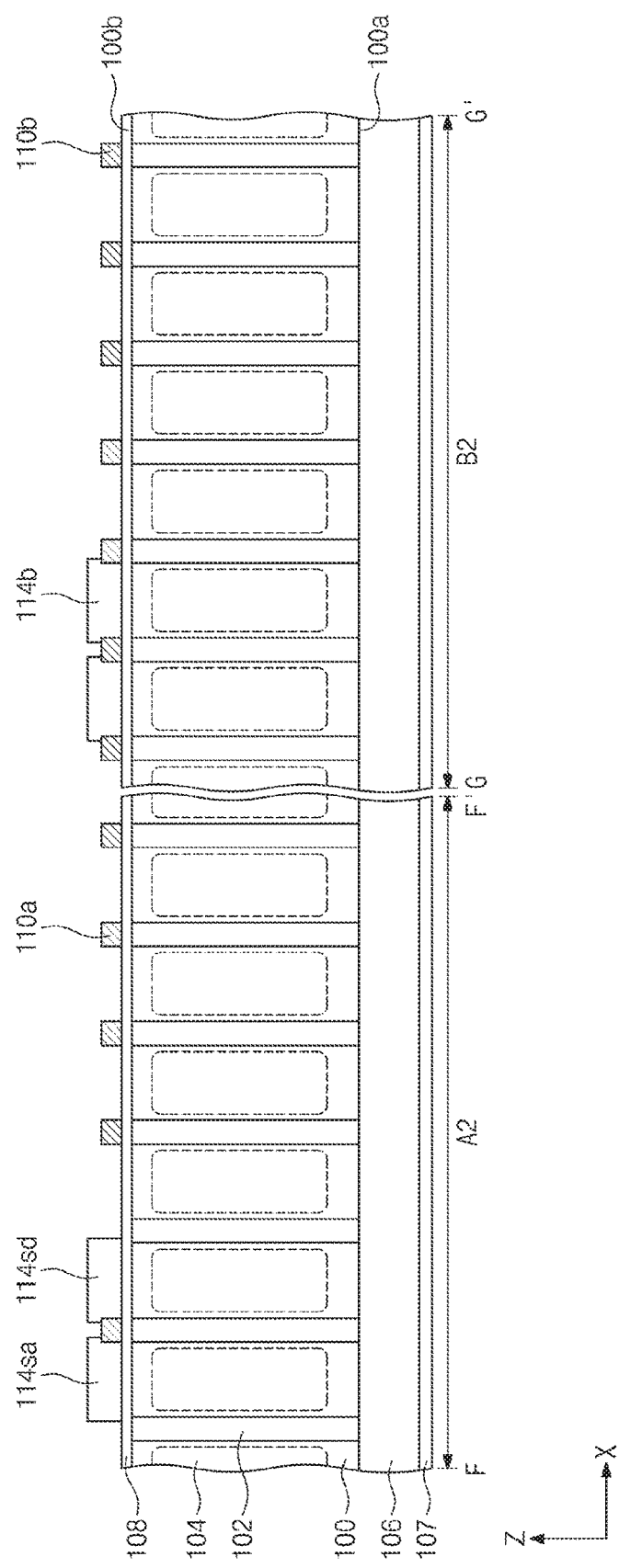

Referring to FIGS. 16A and 16B, first dummy color filters 114*a*, first sample dummy color filters 114*sa*, 114*sb*, 114*sc*, and 114*sd*, and first actual color filters 114*b* may be formed on the backside layer 108. The first dummy color filters 114*a*, the first sample dummy color filters 114*sa* to 114*sd*, and the first actual color filters 114*b* may be formed of a photoresist pattern including a pigment or dye having a first color. The first dummy color filters 114*a*, the first sample dummy color filters 114*sa* to 114*sd*, and the first actual color filters 114*b* may be formed to have island shapes spaced apart from each other. In some embodiments, the same four ones of the first dummy color filters 114*a*, the first sample dummy color filters 114*sa* to 114*sd*, and the first actual color filters 114*b* may be adjacently disposed in a 2×2 arrangement. The first sample dummy color filters 114*sa* to 114*sd* may include a first a sub-sample dummy color filter 114*sa*, a first b sub-sample dummy color filter 114*sb*, a first c sub-sample dummy color filer 114*sc*, and a first d sub-sample dummy color filter 114*sd*. The first a to d sub-sample dummy color filters 114*sa* to 114*sd* may collectively comprise a plurality of sub-sample dummy color filters that are adjacent to each other and may organize one set that constitutes the 2×2 arrangement.

The first sample dummy color filters 114*sa* to 114*sd* may be used to measure an eighth critical dimension CD8. The eighth critical dimension CD8 may be determined by a width of the one set organized by the first a to d sub-sample dummy color filters 114*sa* to 114*sd*, instead of each width of the first sample dummy color filters 114*sa* to 114*sd*. For example, the first b and c sub-sample dummy color filters 114*sb* and 114*sc* may be adjacent to each other. The first b sub-sample dummy color filter 114*sb* may have a fifth point P5 on its sidewall that is farthest away from the first c sub-sample dummy color filter 114*sc*. The first c sub-sample dummy color filter 114*sc* may have a sixth point P6 on its sidewall that is farthest away from the first b sub-sample dummy color filter 114*sb*. A straight line connecting the fifth and sixth points P5 and P6 may be parallel to a first direction X perpendicular to the second direction Y. The eighth critical dimension CD8 may correspond to a distance between the fifth and sixth points P5 and P6. At the fifth point P5, the first b sub-sample dummy color filter 114*sb* may not overlap, nor adjoin, but be spaced apart from the dummy light-shield pattern 110*a*. At the sixth point P6, the first c sub-sample dummy color filter 114*sc* may not overlap, nor adjoin, but be spaced apart from the dummy light-shield pattern 110*a*. Accordingly, the eighth critical dimension CD8 may be accurately measured without interference of the dummy light-shield patterns 110*a*. The first sample dummy color filters 114*sa* to 114*sd* may have their sidewalls ones of which, which are irrelevant to measurement of the eighth critical dimension CD8, are in contact with the dummy light-shield patterns 110*a*. For example, the first b sub-sample dummy color filter 114*sb* may have four sidewalls, three ones of which include no fifth point P5 thereon and are in contact with the dummy light-shield patterns 110*a*.

Figure 17A:
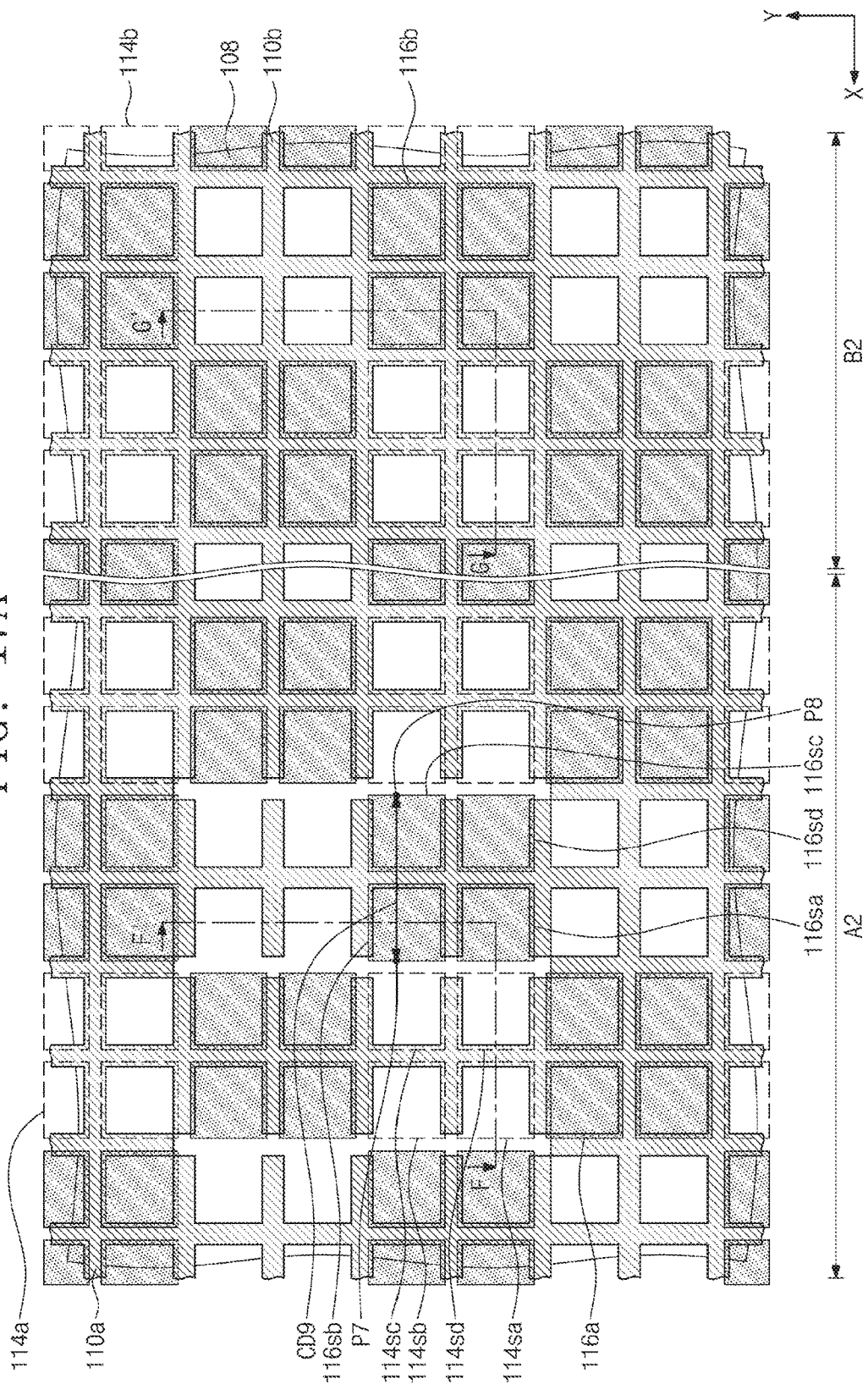
Figure 17B:
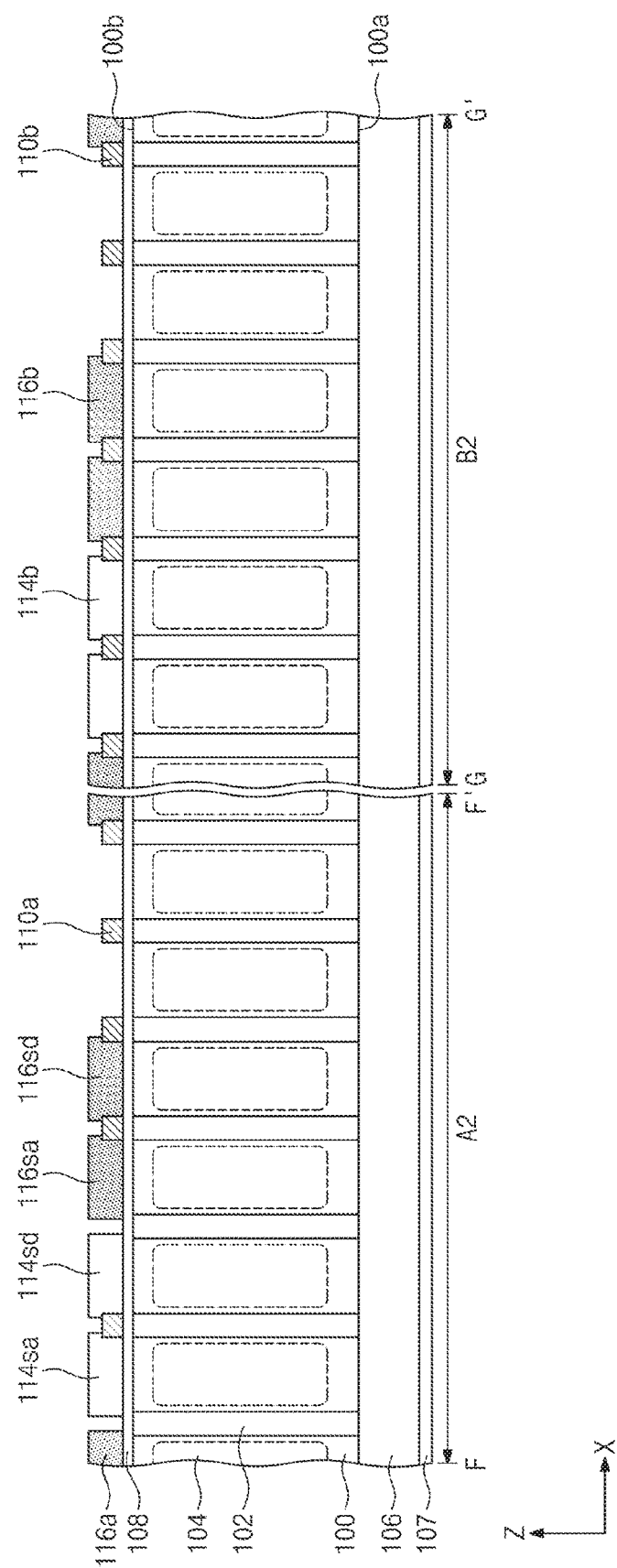

Referring to FIGS. 17A and 17B, second dummy color filters 116*a*, second sample dummy color filters 116*sa*, 116*sb*, 116*sc*, and 116*sd*, and second actual color filters 116*b* may be formed on the backside layer 108. The second dummy color filters 116*a*, the second sample dummy color filters 116*sa* to 116*sd*, and the second actual color filters 116*b* may be formed of a photoresist pattern including a pigment or dye having a second color different from the first color. In some embodiments, the same four ones of the second dummy color filters 116*a*, the second sample dummy color filters 116*sa* to 116*sd*, and the second actual color filters 116*b* may be adjacently disposed in a 2×2 arrangement. The second sample dummy color filters 116*sa* to 116*sd* may include a second a sub-sample dummy color filter 116*sa*, a second b sub-sample dummy color filter 116*sb*, a second c sub-sample dummy color filer 116*sc*, and a second d sub-sample dummy color filter 116*sd*. The second a to d sub-sample dummy color filters 116*sa* to 116*sd* may organize one set that constitutes the 2×2 arrangement.

The second sample dummy color filters 116*sa* to 116*sd* may be used to measure a ninth critical dimension CD9. The ninth critical dimension CD9 may be determined by a width of the one set organized by the second a to d sub-sample dummy color filters 116*sa* to 116*sd*, instead of each width of the second sample dummy color filters 116*sa* to 116*sd*. For example, the second b and c sub-sample dummy color filters 116*sb* and 116*sc* may be adjacent to each other. The second b sub-sample dummy color filter 116*sb* may have a seventh point P7 on its sidewall that is farthest away from the second c sub-sample dummy color filter 116*sc*. The second c sub-sample dummy color filter 116*sc* may have an eighth point P8 on its sidewall that is farthest away from the second b sub-sample dummy color filter 116*sb*. A straight line connecting the seventh and eighth points P7 and P8 may be parallel to the first direction X perpendicular to the second direction Y. The ninth critical dimension CD9 may correspond to a distance between the seventh and eighth points P7 and P8. At the seventh point P7, the second b sub-sample dummy color filter 116*sb* may not overlap, nor adjoin, but be spaced apart from the dummy light-shield pattern 110*a*. At the eighth point P8, the second c sub-sample dummy color filter 116*sc* may not overlap, nor adjoin, but be spaced apart from the dummy light-shield pattern 110*a*. Accordingly, the ninth critical dimension CD9 may be accurately measured without interference of the dummy light-shield patterns 110*a*. The second sample dummy color filters 116*sa* to 116*sd* may have their sidewalls ones of which, which are irrelevant to measurement of the ninth critical dimension CD9, are in contact with the dummy light-shield patterns 110*a*. For example, the second b sub-sample dummy color filter 116*sb* may have four sidewalls, three ones of which include no seventh point P7 thereon and are in contact with the dummy light-shield patterns 110*a*.

Figure 18A:
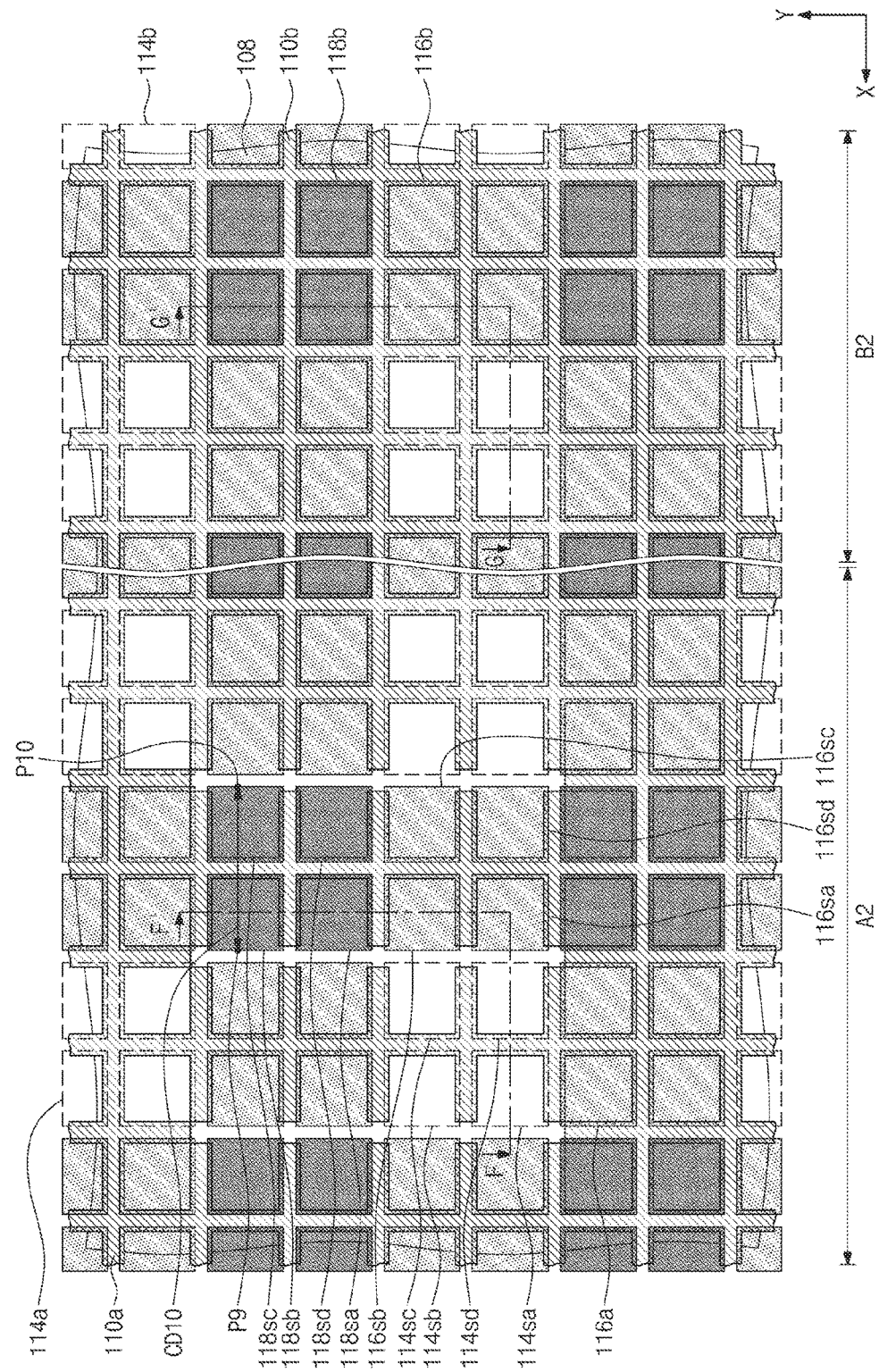
Figure 18B:
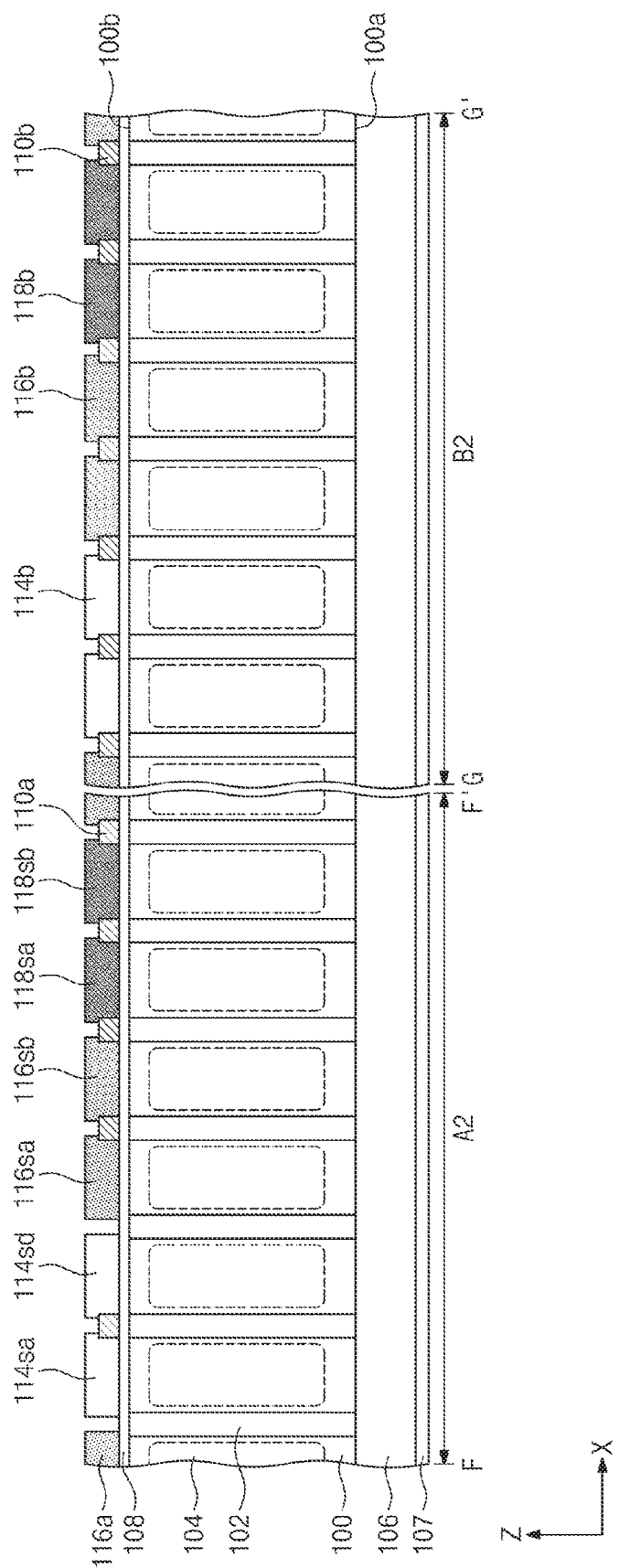

Referring to FIGS. 18A and 18B, third dummy color filters 118*a*, third sample dummy color filters 118*sa*, 118*sb*, 118*sc*, and 118*sd*, and third actual color filters 118*b* may be formed on the backside layer 108. The third dummy color filters 118*a*, the third sample dummy color filters 118*sa* to 118*sd*, and the third actual color filters 118*b* may be formed of a photoresist pattern including a pigment or dye having a third color different from the first and second colors. In some embodiments, the same four ones of the third dummy color filters 118*a*, the third sample dummy color filters 118*sa* to 118*sd*, and the third actual color filters 118*b* may be adjacently disposed in a 2×2 arrangement. The third sample dummy color filters 118*sa* to 118*sd* may include a third a sub-sample dummy color filter 118*sa*, a third b sub-sample dummy color filter 118*sb*, a third c sub-sample dummy color filer 118*sc*, and a third d sub-sample dummy color filter 118*sd*. The third a to d sub-sample dummy color filters 118*sa* to 118*sd* may organize one set that constitutes the 2×2 arrangement.

The third sample dummy color filters 118*sa* to 118*sd* may be used to measure a tenth critical dimension CD10. The tenth critical dimension CD10 may be determined by a width of the one set organized by the third a to d sub-sample dummy color filters 118*sa* to 118*sd*, instead of each width of the third sample dummy color filters 118*sa* to 118*sd*. For example, the third b and c sub-sample dummy color filters 118*sb* and 118*sc* may be adjacent to each other. The third b sub-sample dummy color filter 118*sb* may have a ninth point P9 on its sidewall that is farthest away from the third c sub-sample dummy color filter 118*sc*. The third c sub-sample dummy color filter 118*sc* may have a tenth point P10 on its sidewall that is farthest away from the third b sub-sample dummy color filter 118*sb*. A straight line connecting the ninth and tenth points P9 and P10 may be parallel to the first direction X perpendicular to the second direction Y. The tenth critical dimension CD10 may correspond to a distance between the ninth and tenth points P0 and P10. At the ninth point P9, the third b sub-sample dummy color filter 118*sb* may not overlap, nor adjoin, but be spaced apart from the dummy light-shield pattern 110*a*. At the tenth point P10, the third c sub-sample dummy color filter 118*sc* may not overlap, nor adjoin, but be spaced apart from the dummy light-shield pattern 110*a*. Accordingly, the tenth critical dimension CD10 may be accurately measured without interference of the dummy light-shield patterns 110*a*. The third sample dummy color filters 118*sa* to 118*sd* may have their sidewalls ones of which, which are irrelevant to measurement of the tenth critical dimension CD10, are in contact with the dummy light-shield patterns 110*a*. For example, the third b sub-sample dummy color filter 118*sb* may have four sidewalls, three ones of which include no ninth point P9 thereon and are in contact with the dummy light-shield patterns 110*a*.

Subsequently, micro-lenses 120 may be formed as discussed above with reference to FIGS. 14A and 14B.

Figure 19:
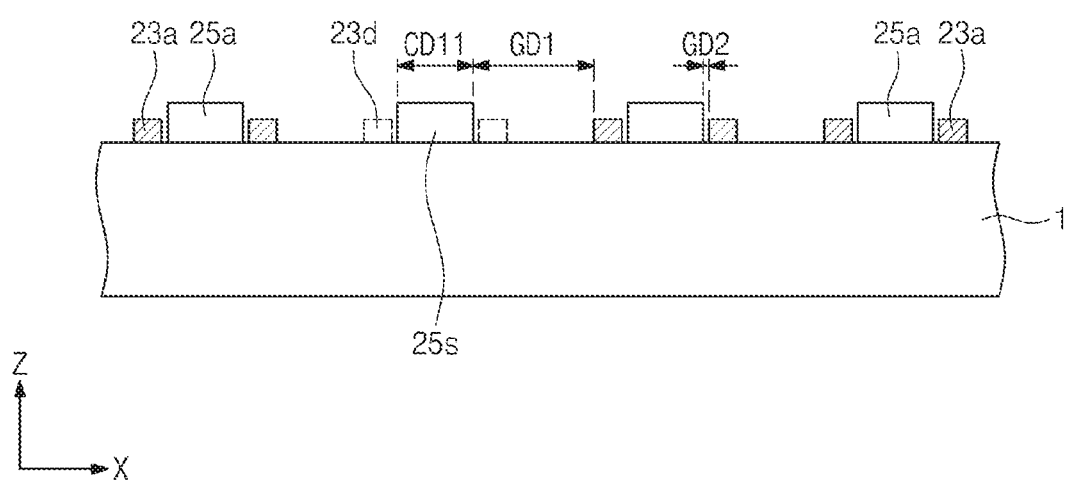
FIG. 19 illustrates a cross-sectional view showing a semiconductor device according to some example embodiments of the present inventive concepts.

FIG. 19 illustrates a cross-sectional view showing a semiconductor device according to some example embodiments of the present inventive concepts.

Referring to FIG. 19, first patterns 23*a* may be formed on a semiconductor substrate 1. Some of the first patterns 23*a* may be removed. For example, a removal may be performed on the first patterns 23*a* adjacent to a second sample pattern 25*s* that is dedicated to measuring a critical dimension in a subsequent process. Alternatively, from the beginning when the first patterns 23*a* is formed, the first patterns 23*a* may not be formed on an area adjacent to a position where a second sample pattern 25*s* is formed in a subsequent process. Second patterns 25*a* and at least one second sample pattern 25*s* may be formed to have the same shape and interval on the semiconductor substrate 1. One second pattern 25*a* may be formed between, for example, two neighboring first patterns 23*a*. For example, the second pattern 25*a* may be disposed between every second pair of the first patterns 23*a*.

Two first patterns 23*a* may be disposed between two second patterns 25*a*. The second sample pattern 25*s* may be formed between positions where the first patterns 23*d* are removed. The second sample pattern 25*s* may not adjoin, nor vertically overlap, but be far away from the first patterns 23*a*. The second sample pattern 25*s* may be used to measure its eleventh critical dimension CD11. At the point where a critical dimension (e.g., the eleventh critical dimension CD11) is measured, the second sample pattern 25*s* and its most adjacent first pattern 23*a* may be spaced part at a first horizontal distance GD1 of more than about 100 nm in a measured direction of the eleventh critical dimension CD11. The first horizontal distance GD1 may be greater than a second horizontal direction GD2 between the second pattern 25*a* and its most adjacent first pattern 23*a*. In some embodiments, the patterns 23*a*, 25*a*, and 25*s* may not be confined on any one of dummy and device regions (see A and B of FIGS. 1A and 1B).

According to some example embodiments of the present inventive concepts, patterns may be measured to obtain accurate critical dimensions in manufacturing semiconductor devices and image sensors. Therefore, measurement reliability may be improved. Furthermore, the present inventive concepts may provide highly reliable semiconductor devices and image sensors.

What is claimed is:

1. A semiconductor device, comprising:
   a plurality of first patterns on a semiconductor substrate; and
   a plurality of second patterns and at least one second sample pattern on the semiconductor substrate,
   wherein the second patterns and the at least one second sample pattern have a common shape and width, the second patterns being horizontally spaced apart at an equal interval from the at least one second sample pattern,
   wherein the second sample pattern includes a first sidewall, a second sidewall facing the first sidewall, a first point on the first sidewall, and a second point on the second sidewall, and
   wherein the second sample pattern and an adjacent first pattern of the plurality of first patterns in relation to the second sample pattern are spaced apart from each other at a first horizontal distance in a direction parallel to a line connecting the first point and the second point, the first horizontal distance greater than a second horizontal distance in the direction between one second pattern of the plurality of second patterns and an adjacent first pattern of the plurality of first patterns in relation to the one second pattern.

2. The semiconductor device of claim 1, wherein
   the semiconductor substrate includes a dummy region and a device region,
   the plurality of first patterns and the plurality of second patterns are on both the dummy region and the device region, and
   the second sample pattern is on the dummy region.

3. The semiconductor device of claim 1, wherein the plurality of first patterns excludes any first patterns between the second sample pattern and an adjacent second pattern of the plurality of second patterns in relation to the second sample pattern in the direction.

4. The semiconductor device of claim 1, wherein the second sample pattern is spaced apart in the direction from at least one adjacent pattern of an adjacent second pattern of the plurality of second patterns in relation to the second sample pattern and the adjacent first pattern of the plurality of first patterns in relation to the second sample pattern at a horizontal distance of more than about 100 nm.

5. The semiconductor device of claim 1, further comprising:
   an interlayer dielectric layer covering the semiconductor substrate, the interlayer dielectric layer between the plurality of second patterns and the plurality of first patterns, the interlayer dielectric layer between the second sample pattern and the plurality of first patterns.

6. The semiconductor device of claim 1, wherein the second sample pattern includes a plurality of sub-sample patterns, and the plurality of sub-sample patterns are adjacent to each other.

7. The semiconductor device of claim 1, wherein
the plurality of first patterns are a plurality of light-shield patterns, and
the plurality of second patterns and the second sample pattern are color filters.

8. A semiconductor device, comprising:
a plurality of first device patterns on a device region of a semiconductor substrate and a plurality of first dummy patterns on a dummy region of the semiconductor substrate;
a plurality of second device patterns on the device region of the semiconductor substrate; and
a plurality of second dummy patterns and at least one second sample dummy pattern on the dummy region of the semiconductor substrate,
wherein the second sample dummy pattern includes a first sidewall, a second sidewall facing the first sidewall, a first point on the first sidewall, and a second point on the second sidewall, and
wherein the at least one second sample dummy pattern and an adjacent first dummy pattern of the plurality of first dummy patterns in relation to the second sample dummy pattern are spaced apart from each other at a first horizontal distance in a direction parallel to a line connecting the first point and the second point, the first horizontal distance greater than a second horizontal distance in the direction between one second device pattern of the plurality of second device patterns and an adjacent first device pattern of the plurality of first device patterns in relation to the one second device pattern.

9. The semiconductor device of claim 8, wherein
the plurality of first dummy patterns and the plurality of first device patterns are a plurality of light-shield patterns,
the plurality of second dummy patterns, the at least one second sample dummy pattern, and the plurality of second device patterns are color filters, and
the plurality of first dummy patterns and the plurality of first device patterns are connected such that the plurality of first dummy patterns and the plurality of first device patterns collectively comprise a net shape, in a plan view.

10. The semiconductor device of claim 9, wherein at least one first dummy pattern of the plurality of first dummy patterns that is adjacent to the second sample dummy pattern includes an opening having a bar shape or a cross shape.

11. The semiconductor device of claim 8, wherein the second sample dummy pattern includes a third sidewall connecting respective first ends of the first and second sidewalls and a fourth sidewall connecting respective opposite, second ends of the first and second sidewalls, at least one sidewall of the third sidewall and the fourth sidewall being in contact with the plurality of first dummy patterns.

12. The semiconductor device of claim 8, wherein the second sample dummy pattern is spaced apart in the direction from at least one adjacent pattern of an adjacent second dummy pattern of the plurality of second dummy patterns in relation to the second sample dummy pattern and the adjacent first dummy pattern of the plurality of first dummy patterns in relation to the second sample dummy pattern at a horizontal distance of more than about 100 nm.

13. The semiconductor device of claim 8, wherein the second sample dummy pattern includes a plurality of sub-sample patterns, and the plurality of sub-sample patterns are adjacent to each other.

14. An image sensor, comprising:
a plurality of actual light-shield patterns on an actual pixel region of a semiconductor substrate and a plurality of dummy light-shield patterns on a dummy pixel region of the semiconductor substrate;
a plurality of first actual color filters on the actual pixel region of the semiconductor substrate; and
a plurality of first dummy color filters and at least one first sample dummy color filter on the dummy pixel region of the semiconductor substrate,
wherein the at least one first sample dummy color filter includes a first sidewall, a second sidewall facing the first sidewall, a first point on the first sidewall, and a second point on the second sidewall, and
wherein the at least one first sample dummy color filter and an adjacent dummy light-shield pattern of the plurality of dummy light-shield patterns in relation to the at least one first sample dummy color filter are spaced apart from each other at a first horizontal distance in a first direction parallel to a line connecting the first point and the second point, the first horizontal distance greater than a second horizontal distance in the first direction between one first actual color filter of the plurality of first actual color filters and an adjacent actual light-shield pattern of the plurality of actual light-shield patterns in relation to the one first actual color filter.

15. The image sensor of claim 14, further comprising:
a plurality of second actual color filters on the actual pixel region of the semiconductor substrate; and
a plurality of second dummy color filters and at least one second sample dummy color filter on the dummy pixel region of the semiconductor substrate,
wherein the at least one second sample dummy color filter includes a third sidewall, a fourth sidewall facing the third sidewall, a third point on the third sidewall, and a fourth point on the fourth sidewall, and
wherein the at least one second sample dummy color filter and an adjacent dummy light-shield pattern of the plurality of dummy light-shield patterns in relation to the at least one second sample dummy color filter are spaced apart from each other at a third horizontal distance in a second direction parallel to a line connecting the third point and the fourth point, the third horizontal distance greater than a fourth horizontal distance in the second direction between one second actual color filter of the plurality of second actual color filters and an adjacent actual light-shield pattern of the plurality of actual light-shield patterns in relation to the one second actual color filter.

16. The image sensor of claim 15, further comprising
a plurality of third actual color filters on the actual pixel region of the semiconductor substrate; and
a plurality of third dummy color filters and at least one third sample dummy color filter on the dummy pixel region of the semiconductor substrate,
wherein the at least one third sample dummy color filter includes a fifth sidewall, a sixth sidewall facing the fifth sidewall, a fifth point on the fifth sidewall, and a sixth point on the sixth sidewall, and wherein the at least one third sample dummy color filter and an adjacent dummy light-shield pattern of the plurality of dummy light-shield patterns in relation to the at least one third sample dummy color filter are spaced apart from each other at a fifth horizontal distance in a third direction parallel to a line connecting the fifth point and the sixth point, the fifth horizontal distance greater than a sixth horizontal distance in the third direction between one third actual color filter of the plurality of third actual color filters and an adjacent actual light-shield pattern of the plurality of actual light-shield patterns in relation to the one third actual color filter.

17. The image sensor of claim 16, wherein
the at least one first sample dummy color filter, the at least one second sample dummy color filter, and the at least one third sample dummy color filter have different colors from each other, and
one sample dummy color filter of the at least one first sample dummy color filter, the at least one second sample dummy color filter, and the at least one third sample dummy color filter includes a plurality of sidewalls that are adjacent to a remainder plurality of sample dummy color filters of the at least one first sample dummy color filter, the at least one second sample dummy color filter, and the at least one third sample dummy color filter.

18. The image sensor of claim 14, wherein the at least one first sample dummy color filter includes a plurality of sub-sample dummy color filters, and the plurality of sub-sample dummy color filters are adjacent to each other.

19. The image sensor of claim 14, wherein the at least one first sample dummy color filter is spaced apart in the first direction from the adjacent dummy light-shield pattern of the plurality of dummy light-shield patterns in relation to the first sample dummy color filter at a horizontal distance of more than about 100 nm.

20. The image sensor of claim 14, wherein the first sample dummy color filter further includes a third sidewall connecting respective first ends of the first and second sidewalls and a fourth sidewall connecting respective opposite, second ends of the first and second sidewalls, at least one sidewall of the third sidewall and the fourth sidewall being in contact with the plurality of dummy light-shield patterns.

* * * * *